(12) United States Patent (10) Patent No.: US 9,219,032 B2
Ramachandran et al. (45) Date of Patent: Dec. 22, 2015

(54) INTEGRATING THROUGH SUBSTRATE VIAS FROM WAFER BACKSIDE LAYERS OF INTEGRATED CIRCUITS

(71) Applicant: QUALCOMM Incorporated, San Diego, CA (US)

(72) Inventors: Vidhya Ramachandran, San Diego, CA (US); Shiqun Gu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/790,625

(22) Filed: Mar. 8, 2013

(65) Prior Publication Data
US 2014/0008757 A1 Jan. 9, 2014

Related U.S. Application Data

(60) Provisional application No. 61/669,611, filed on Jul. 9, 2012.

(51) Int. Cl.
*H01L 23/498* (2006.01)
*H01L 21/768* (2006.01)
*H01L 23/48* (2006.01)

(52) U.S. Cl.
CPC .... *H01L 23/49827* (2013.01); *H01L 21/76877* (2013.01); *H01L 21/76898* (2013.01); *H01L 23/481* (2013.01); *H01L 2224/02372* (2013.01); *H01L 2224/0401* (2013.01); *H01L 2224/05* (2013.01); *H01L 2224/05548* (2013.01); *H01L 2224/13024* (2013.01)

(58) Field of Classification Search
CPC ................... H01L 23/49827; H01L 21/76877; H01L 21/76898
USPC .......................................... 257/774, E23.067
See application file for complete search history.

(56) References Cited

U.S. PATENT DOCUMENTS 6,638,844 B1  10/2003  Verma et al.
7,531,407 B2   5/2009  Clevenger et al.
(Continued)

FOREIGN PATENT DOCUMENTS

WO    WO-2009115449 A1    9/2009

OTHER PUBLICATIONS

International Search Report and Written Opinion—PCT/US2013/049686—ISA/EPO—Nov. 12, 2013.
(Continued)

*Primary Examiner* — Amar Movva
(74) *Attorney, Agent, or Firm* — Michelle S. Gallardo

(57) ABSTRACT

A semiconductor wafer has an integrated through substrate via created from a backside of the semiconductor wafer. The semiconductor wafer includes a semiconductor substrate and a shallow trench isolation (STI) layer pad on a surface of the semiconductor substrate. The semiconductor wafer also includes an inter-layer dielectric (ILD) layer formed on a contact etch stop layer, separating the ILD layer from the STI layer pad on the surface of the semiconductor substrate. The semiconductor wafer further includes a through substrate via that extends through the STI layer pad and the semiconductor substrate to couple with at least one contact within the ILD layer. The through substrate via includes a conductive filler material and a sidewall isolation liner layer. The sidewall isolation liner layer has a portion that possibly extends into, but not through, the STI layer pad.

10 Claims, 27 Drawing Sheets

(56) References Cited

U.S. PATENT DOCUMENTS

| | | |
|---|---|---|
| 7,741,218 B2 | 6/2010 | Sparks et al. |
| 7,786,584 B2 | 8/2010 | Barth et al. |
| 2009/0309232 A1* | 12/2009 | Roy .............................. 257/774 |
| 2010/0090318 A1 | 4/2010 | Hsu et al. |
| 2011/0089572 A1 | 4/2011 | Tezcan et al. |
| 2012/0007154 A1 | 1/2012 | Lin et al. |

OTHER PUBLICATIONS

Taiwan Search Report—TW102124641—TIPO—Feb. 6, 2015.

* cited by examiner

INTEGRATING THROUGH SUBSTRATE VIAS FROM WAFER BACKSIDE LAYERS OF INTEGRATED CIRCUITS

CROSS-REFERENCE TO RELATED APPLICATION

The present application claims the benefit of U.S. Provisional Patent Application No. 61/669,611 filed on Jul. 9, 2012, in the names of V. Ramachandran et al., the disclosure of which is expressly incorporated by reference herein in its entirety.

BACKGROUND

1. Field

The present disclosure generally relates to integrated circuits (ICs). More specifically, the present disclosure relates to integrating through substrate vias (TSVs) created from a wafer backside into advanced CMOS (complementary metal oxide semiconductor) nodes.

2. Background

The process flow for semiconductor fabrication of integrated circuits (ICs) may include front-end-of-line (FEOL), middle of line (MOL), and back-end-of-line (BEOL) processes. The FEOL process may include wafer preparation, isolation, well formation, gate patterning, spacer, extension and source/drain implantation, silicide formation, and dual stress liner formation. The MOL process may include gate contact formation. Middle of line layers may include, but are not limited to, MOL contacts, vias or other layers within close proximity to the semiconductor device transistors or other like active devices. The BEOL processes may include a series of wafer processing steps for interconnecting the semiconductor devices created during the FEOL and MOL processes. Successful fabrication of modern semiconductor chip products involves an interplay between the materials and the processes employed.

A TSV (through substrate via) is generally used to access active devices on a front side of an integrated circuit (IC) device. The TSV co-exists at the same level as MOL components (e.g., MOL contacts and vias). TSV fabrication, however, presents various challenges with node size scaling below forty-five (45) nanometers (nm). MOL device features are on the order of ten (10) nanometers (nm); however, the TSV is on the order of micrometers (ums). Consequently, a small variation in the TSV fabrication process may damage the MOL devices.

SUMMARY

According to one aspect of the present disclosure, a semiconductor wafer having an integrated through substrate via created from a backside of the semiconductor wafer is described. The semiconductor wafer includes a semiconductor substrate and a shallow trench isolation (STI) layer pad on a surface of the semiconductor substrate. The semiconductor wafer also includes an inter-layer dielectric (ILD) layer formed on a contact etch stop layer, separating the ILD layer from the STI layer pad on the surface of the semiconductor substrate. The semiconductor wafer further includes a through substrate via extending through the STI layer pad and the semiconductor substrate to couple with at least one contact within the ILD layer. The through substrate via includes a conductive filler material and a sidewall isolation liner layer. The sidewall isolation liner layer has a portion that possibly extends into, but not through, the STI layer pad.

According another aspect of the present disclosure, a method for integrating through substrate vias (TSVs) from a wafer backside into advanced CMOS (complementary metal oxide semiconductor) nodes is described. The method includes etching a through substrate via (TSV) cavity into a semiconductor substrate. The TSV cavity may extend to a shallow trench isolation (STI) layer pad within the semiconductor substrate. The method also includes etching through the STI layer pad to a film on an interconnect/contact. The method further includes depositing an isolation liner layer within the TSV cavity. The isolation liner layer may include a material that is different from a material of the film on the interconnect/contact. The method also includes etching through the film on the interconnect/contact and a portion of the isolation liner layer to expose the interconnect/contact.

According to a further aspect of the present disclosure, a semiconductor wafer having an integrated through substrate via created from a backside of the semiconductor wafer is described. The semiconductor wafer includes a semiconductor substrate and a shallow trench isolation (STI) layer pad on a surface of the semiconductor substrate. The semiconductor wafer also includes an inter-layer dielectric (ILD) layer formed on a contact etch stop layer, separating the ILD layer from the STI layer pad on the surface of the semiconductor substrate. The semiconductor wafer further includes a means for conducting through a substrate. The conducting means extends through the STI layer pad and the semiconductor substrate to couple with at least one contact within the ILD layer. The conducting means may include a means for isolating sidewalls of the conducting means. The isolating means has a portion that possibly extends into, but not through, the STI layer pad.

This has outlined, rather broadly, the features and technical advantages of the present disclosure in order that the detailed description that follows may be better understood. Additional features and advantages of the disclosure are described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1A:
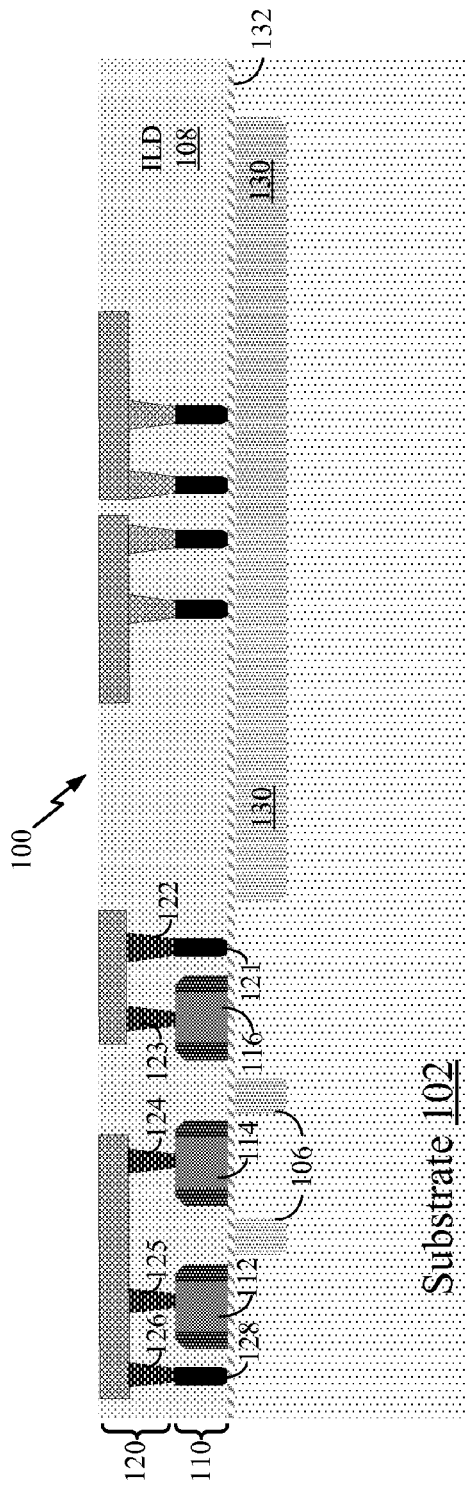
FIGS. 1A and 1B show cross-sectional views illustrating an integrated circuit (IC) device including an etch stop layer for the active devices within a middle of line layer according to one aspect of the disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Various aspects of the disclosure provide techniques for integrating wafer backside through substrate vias (TSVs) with middle of line layers in an integrated circuit (IC). The process flow for semiconductor fabrication of integrated circuits (ICs) may include front-end-of-line (FEOL) processes, middle of line (MOL) processes, and back-end-of-line (BEOL) processes. It will be understood that the term "layer" includes film and is not to be construed as indicating a vertical or horizontal thickness unless otherwise stated. According to one aspect of the disclosure, a TSV is fabricated from a wafer backside to decouple the TSV process from a front-side device fabrication process. In one configuration, a sidewall liner isolation layer within a TSV cavity extends into a shallow trench isolation (STI) layer of a semiconductor wafer. As described herein, the term "semiconductor substrate" may refer to a substrate of a diced wafer or may refer to the substrate of a wafer that is not diced. Similarly, the terms wafer and die may be used interchangeably unless such interchanging would tax credulity.

In one configuration, the sidewall liner isolation layer exhibits a different chemical material property than an STI layer pad and/or the films of the local interconnects (contacts) of an MOL interconnect layer. This configuration provides an improved selectivity for enabling a controlled etch to expose the local interconnects without damaging any active devices within the MOL interconnect layer. In this configuration, where the chemical material property of the sidewall liner isolation layer differs from the STI layer pad, the liner isolation layer is deposited before etching through the STI layer pad. In a configuration where the chemical material property of the sidewall liner isolation layer differs from the films of the local interconnects of the MOL interconnect layer, the sidewall liner isolation layer is fabricated after etching of the STI layer pad. A wafer backside TSV is formed to contact the local interconnects of an MOL interconnect layer. In another configuration, the wafer backside TSV includes a redistribution layer for providing access, for example, to the local interconnects of the MOL interconnect layer.

FIG. 1A shows a cross-sectional view illustrating an integrated circuit (IC) device 100 including active devices 112-116 according to one aspect of the disclosure. Representatively, the IC device 100 includes a semiconductor substrate (e.g., a silicon wafer) 102 having a shallow trench isolation (STI) region 106 and an STI layer pad 130. An inter-layer dielectric (ILD) layer 108 is disposed on the STI region 106 and the STI layer pad 130 of the semiconductor substrate 102. Also provided is an FEOL layer 110 including the active devices (e.g., transistors) 112-116. An MOL interconnect layer 120 is also provided. The ILD layer 108 protects the active devices 112-116 of the FEOL layer 110 and conductive elements (e.g., vias) 121-126 and interconnects (contacts) 121 and 128 of the MOL interconnect layer 120. In this configuration, the ILD layer 108 is formed of a silicon oxide or other like material for preventing shorting between the conductive elements 121-128 of the MOL interconnect layer 120. In an alternative configuration, the ILD layer 108 is a low-K dielectric or other like material.

Figure 1B:
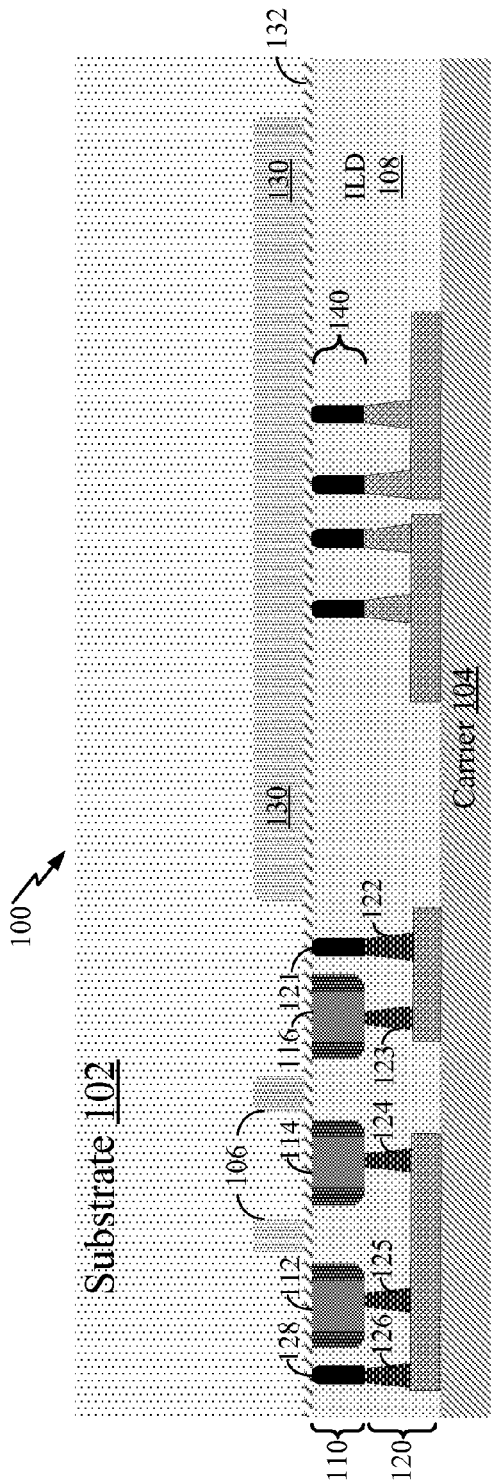

FIG. 1B shows the IC device 100 including a carrier substrate 104 attached to a top surface of the ILD layer 108, opposite from the semiconductor substrate 102. In this configuration, a contact etch stop layer 132 is provided between the ILD layer 108 and the semiconductor substrate 102. A contact etch stop layer may be a layer of a thin film that is used to control wet chemical processes to expose contacts from, for example, an active device layer (e.g., the FEOL layer 110). The contact etch stop layer 132 may be formed of a silicon carbide, silicon nitride, or other like protective material. As further illustrated in FIGS. 1A and 1B, the MOL interconnect layer 120 includes local interconnects (contacts) 140 that are formed within the ILD layer 108. In this configuration, the IC device 100 is fabricated without a TSV, but includes an STI layer pad 130 that may be increased in size for providing a TSV landing area. The semiconductor substrate 102 is thinned to provide a thickness in the range of twenty to one-hundred fifty microns in preparation for etching of a TSV cavity, as shown in FIG. 2.

Figure 2:
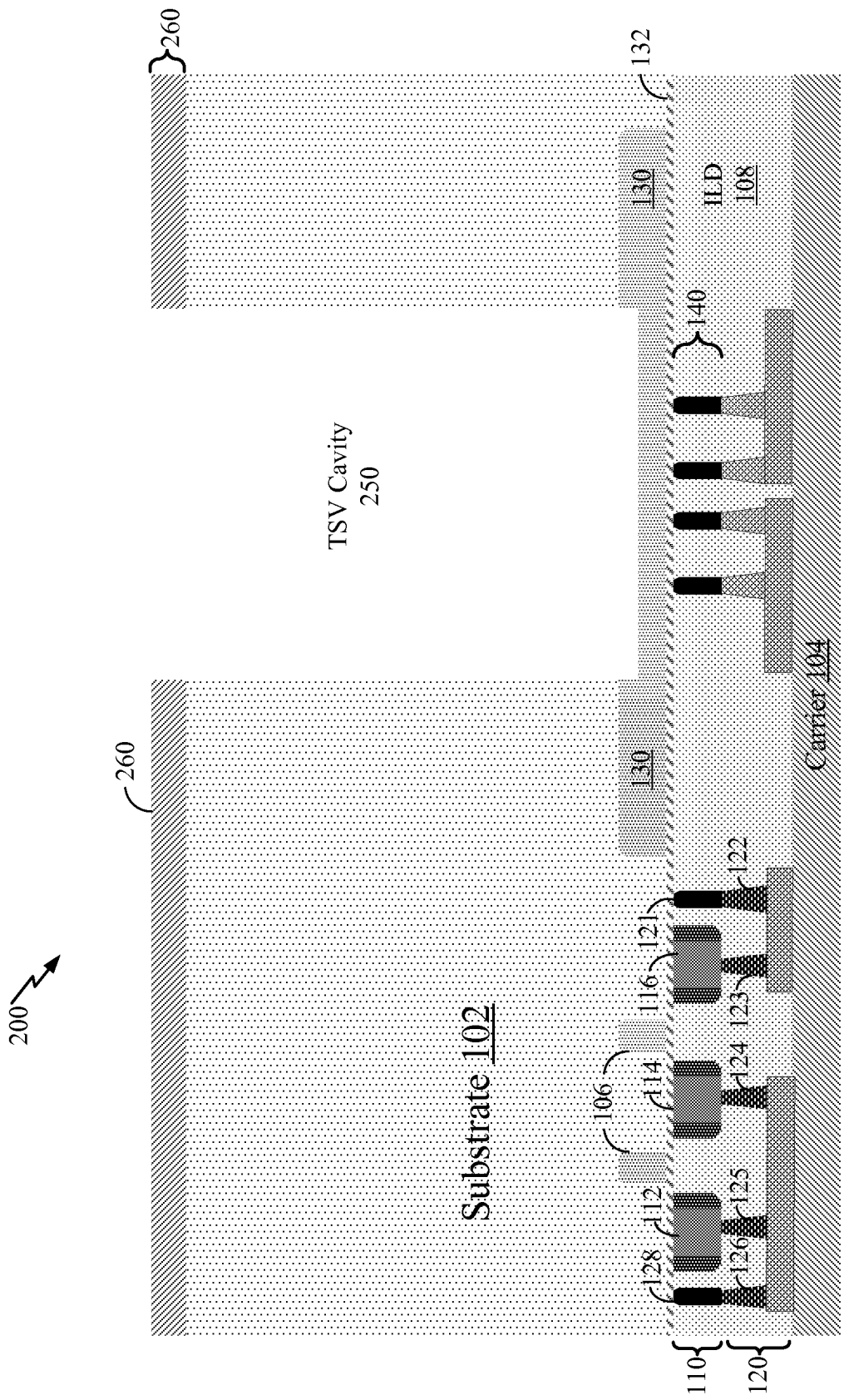
FIG. 2 shows a cross-sectional view illustrating the IC device of FIG. 1B, including a backside isolation layer and a backside through substrate via (TSV) cavity that terminates inside a shallow trench isolation (STI) layer pad according to one aspect of the disclosure.

FIG. 2 shows a cross-sectional view 200 illustrating the IC device of FIG. 1B, including a backside isolation layer 260 and a TSV cavity 250 formed through a backside of the semiconductor substrate 102. Representatively, the TSV cavity 250 terminates inside the STI layer pad 130. In this configuration, the backside isolation layer 260 is formed on a top surface of the semiconductor substrate 102. The backside isolation layer 260 may be formed of a silicon carbide, a silicon nitride, a silicon oxide or other like protective material. Following formation of the backside isolation layer 260, a TSV cavity 250 is patterned and etched to align with the front-side active devices and stop inside the STI layer pad 130. In this configuration, a size of the TSV cavity 250 is on the order of 1-20 micro-meters (μms).

Figure 3:
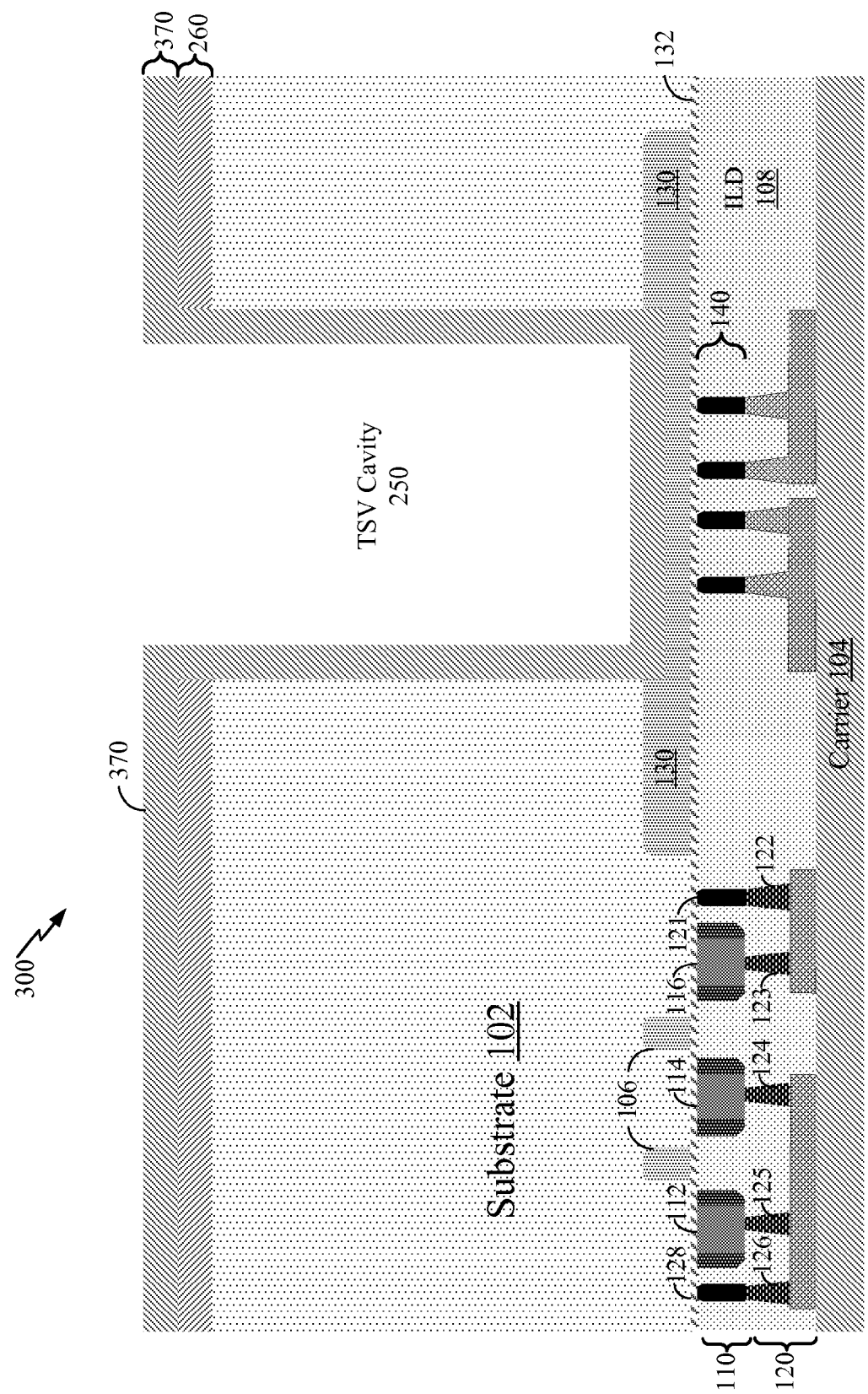
FIG. 3 shows a cross-sectional view of the IC device of FIG. 2, illustrating the deposition of an isolation liner within the TSV cavity and on the backside isolation layer according to one aspect of the disclosure.

FIG. 3 shows a cross-sectional view 300 of the IC device of FIG. 2, illustrating the deposition of an isolation liner layer 370 within the TSV cavity 250 and on the backside isolation layer 260 according to one aspect of the disclosure. In this configuration, an etch and/or lithographic process etches through the semiconductor substrate 102 and a portion of the STI layer pad 130 to form the TSV cavity 250. After the etch is complete, a liner isolation deposition forms the isolation liner layer 370 on the backside isolation layer 260, the sidewalls, and the bottom of the TSV cavity 250. The isolation liner layer 370 may be formed with a layer of polymer, silicon oxide, silicon nitride, or other like precursor for forming an oxide film. The isolation liner layer 370 may have a thickness of one-quarter micron in an exemplary configuration.

Multiple different configurations are contemplated in which a directional (e.g., spacer like) etch is used to expose contact films of an MOL interconnect layer. In aspects of the disclosure described in FIGS. 4-12, where the chemical material property of a sidewall liner isolation layer differs from the STI layer pad, the liner isolation layer is fabricated before etching of the STI layer pad. In aspects of the disclosure involving liner opening lithography, shown in FIGS. 13-26, where the chemical material property of the sidewall liner isolation layer differs from the films of the local interconnects of the MOL interconnect layer, the sidewall liner isolation layer is fabricated after etching of the STI layer pad.

Figure 4:
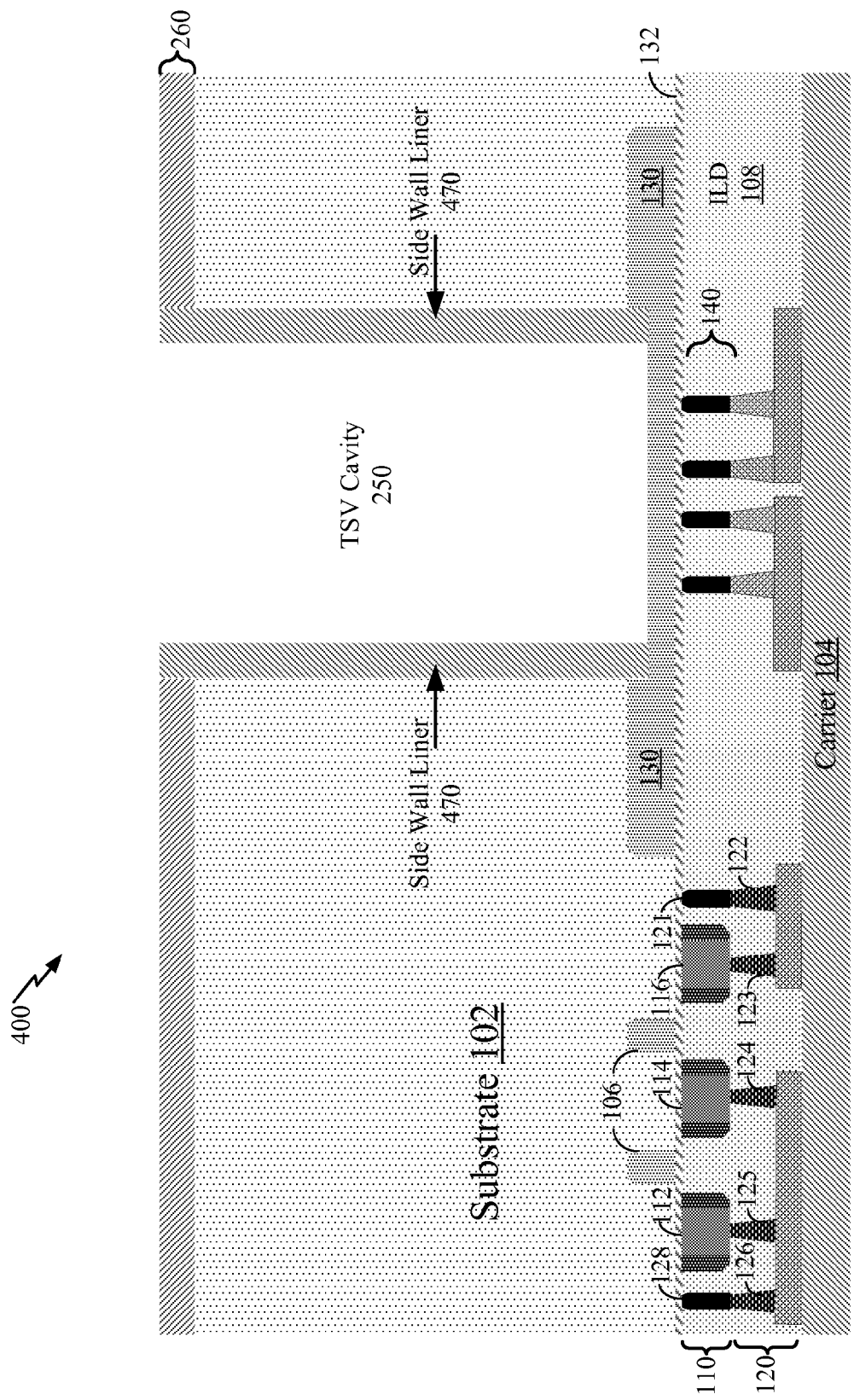
FIG. 4 shows a cross-sectional view of the IC device of FIG. 3, illustrating removal of the isolation liner film on horizontal surfaces to form a sidewall liner according to one aspect of the disclosure.

FIG. 4 shows a cross-sectional view 400 illustrating a first configuration in which removal of the isolation liner layer 370 forms a sidewall isolation liner layer 470 according to one aspect of the disclosure. The isolation liner layer 370 may be removed from the bottom of the TSV cavity 250 and the backside isolation layer 260. Removal of the isolation liner layer 370 enables the formation of the sidewall isolation liner layer 470. In one aspect of the disclosure, the sidewall isolation liner layer 470 exhibits a different chemical material property than the STI layer pad 130. This configuration enables a controlled, directional etch through the semiconductor substrate 102 and possibly into, but not through the STI layer pad 130. That is, a different chemical material property of the sidewall isolation layer 470 enables a controlled etch to expose the STI layer pad 130 without etching through the STI layer pad 130.

The STI layer pad 130 may also exhibit a different chemical material property than the films of the local interconnects (contacts) 140 of the MOL interconnect layer 120. This configuration provides improved selectivity for enabling a controlled, directional etch to expose the local interconnects 140 of the MOL interconnect layer 120. In a configuration where the chemical material property of the sidewall isolation liner layer 470 differs from the STI layer pad 130, the sidewall isolation liner layer 470 is fabricated before etching of the STI layer pad 130. In a configuration where the chemical material property of the sidewall isolation liner layer 470 differs from the films of the local interconnects 140 of the MOL interconnect layer 120, the sidewall isolation liner layer 470 is fabricated after etching of the STI layer pad 130 (see FIGS. 13 to 26). This configuration includes an additional lithographic process for situations where a material etch cannot be performed in a directional manner.

Figure 5:
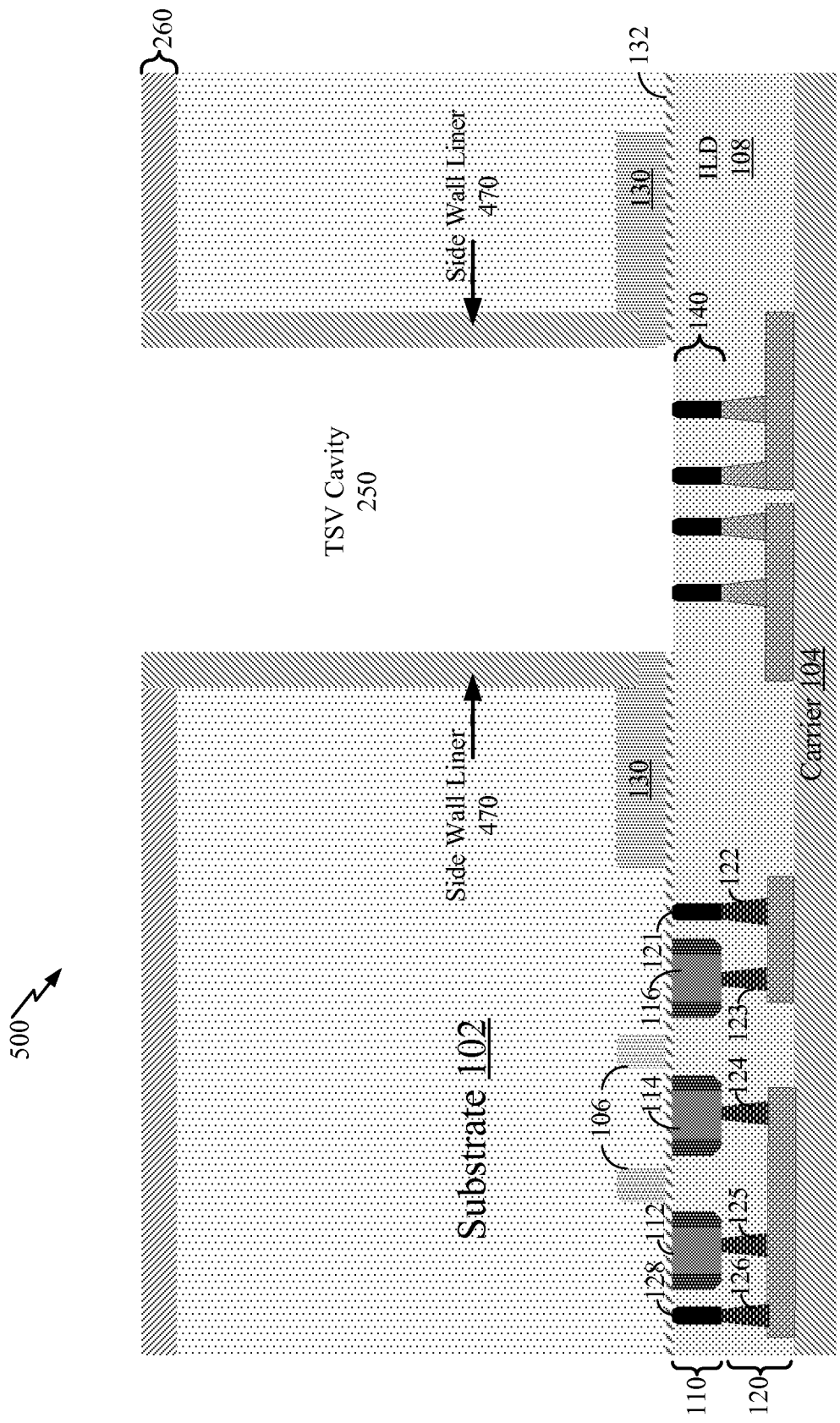
FIG. 5 shows a cross-sectional view illustrating the IC device of FIG. 4, following a controlled, selective etch of a shallow trench isolation layer to expose contacts and/or local interconnects from the active devices within a middle of line layer according to one aspect of the disclosure.

FIG. 5 shows a cross-sectional view 500 illustrating the IC device of FIG. 4, following a controlled, selective etch of the STI layer pad 130 to expose the local interconnects 140 from the active devices within the MOL interconnect layer 120 according to one aspect of the disclosure. As shown in FIG. 5, a directional reactive ion etch (DRIE) occurs at a bottom of the TSV cavity 250. In this configuration, the DRIE may be referred to as a "liner isolation spacer etch" to expose the local interconnects 140. The different etch rates between the sidewall isolation liner layer 470, the STI layer pad 130, and a contact etch stop layer 132 enable a selective etching that stops at the contact etch stop layer 132 to expose the local interconnects 140.

In this aspect of the disclosure, the different chemical material properties of the STI layer pad 130 from the films of the local interconnects 140 enables a directional spacer etch that lessens the impact on the MOL interconnect layer 120 of the semiconductor substrate 102 to reduce the deficiencies (i.e., potential etching of the MOL interconnect layer 120) associated with etching a backside TSV.

Figure 6:
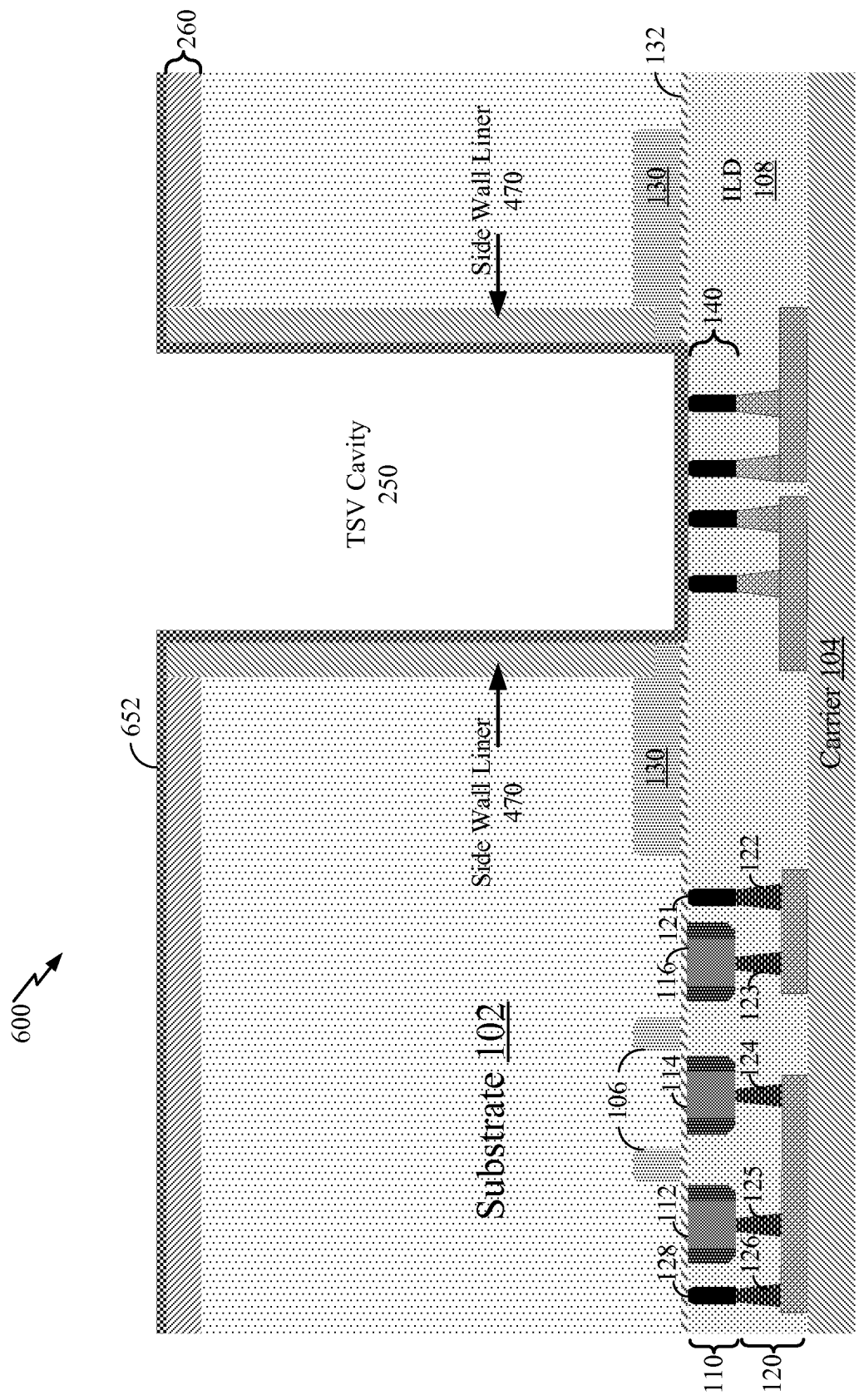
FIG. 6 shows a cross-sectional view illustrating the IC device of FIG. 5, following a TSV barrier seed process according to one aspect of the disclosure.
Figure 7:
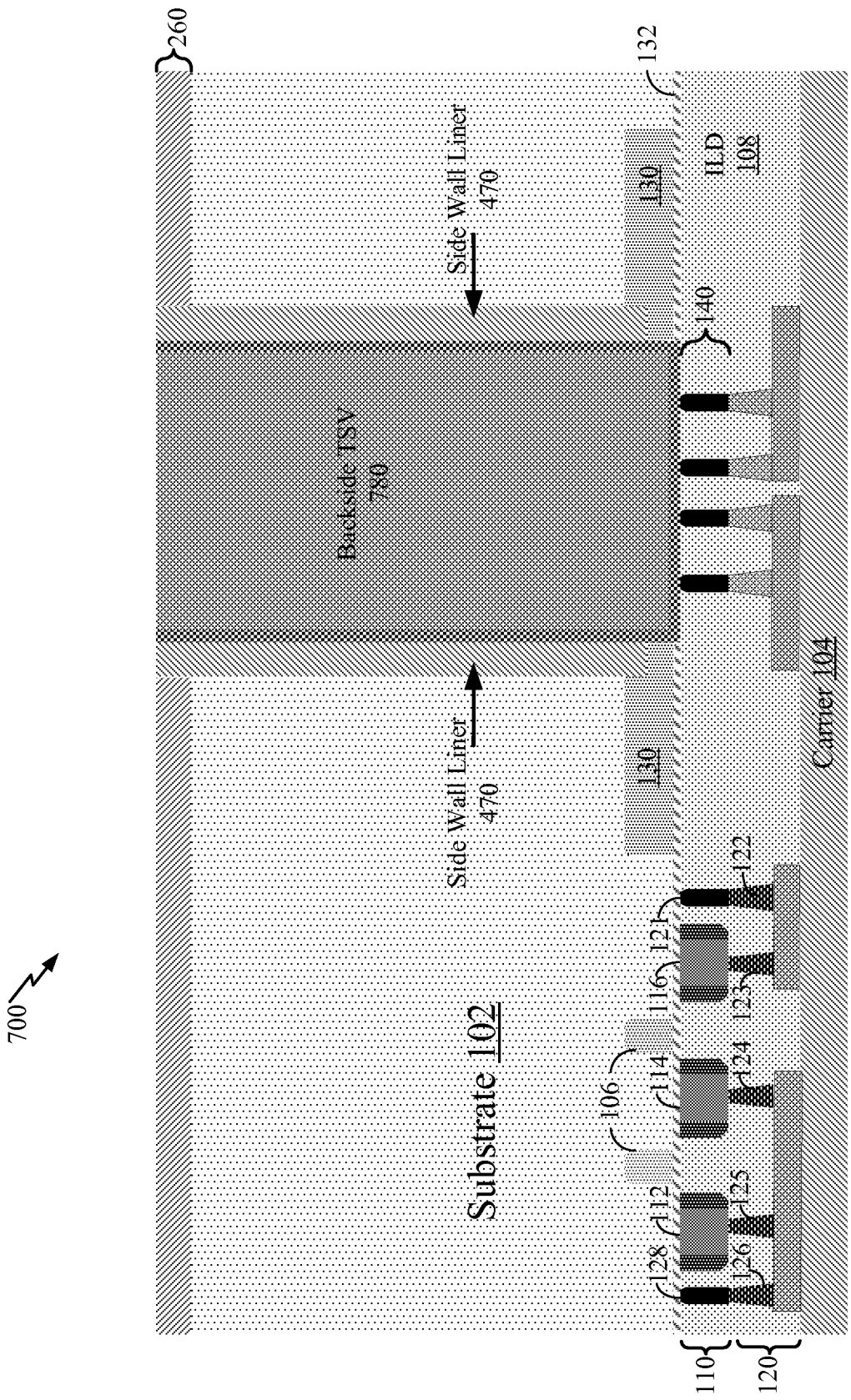
FIG. 7 shows a cross-sectional view illustrating the IC device of FIG. 6, following an electro-chemical deposition and a copper chemical mechanical polish (CMP) process to form a backside TSV according to one aspect of the disclosure.

FIG. 6 shows a cross-sectional view 600 illustrating an IC device of FIG. 5, following a TSV barrier seed fill process to form a barrier seed layer 652 according to one aspect of the disclosure. As shown in FIG. 6, the barrier seed layer 652 lines the TSV cavity 250 with a filler material in preparation for continued formation of a backside TSV, as shown in FIG. 7. In one configuration, the barrier seed layer 652 provides an under bump metallization (UBM) layer.

FIG. 7 shows a cross-sectional view 700 illustrating the IC device of FIG. 6, following an electro-chemical deposition (ECD) and a chemical mechanical polish (CMP) process to form a backside TSV 780 according to one aspect of the disclosure. Representatively, the formation of the TSV cavity for the backside TSV 780 is pre-formed with a selectively controlled etch that exposes the local interconnects 140 without damaging the conductive elements, interconnects and/or contacts of the MOL interconnect layer 120 of the semiconductor substrate 102, as discussed above. In this configuration, the CMP process is applied to a conductive fill material, such as copper, to form the backside TSV 780.

Figure 8:
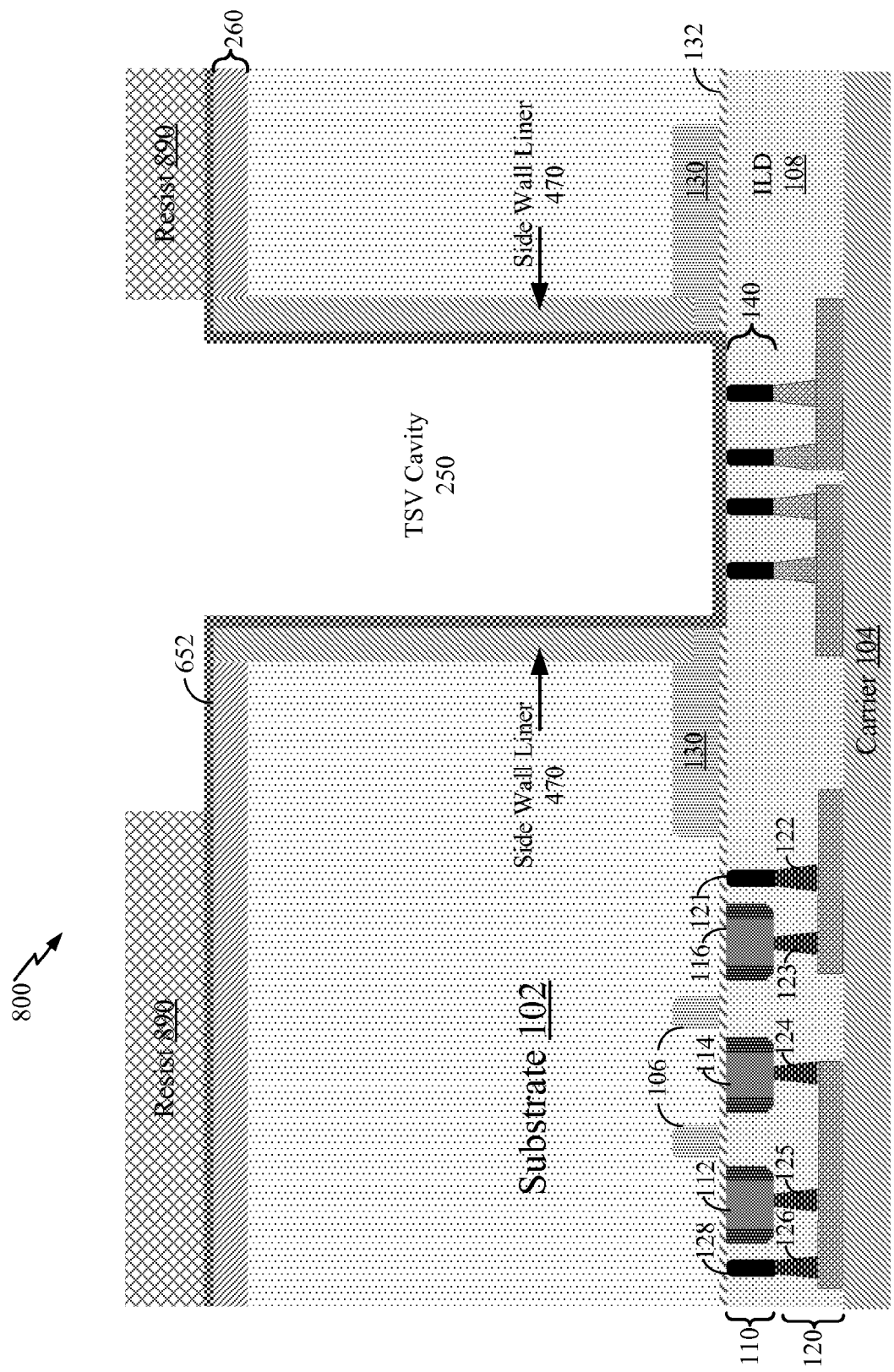
FIG. 8 shows a cross-sectional view illustrating the IC device of FIG. 6, illustrating the formation of a resist on the barrier seed layer as part of an optional redistribution layer (RDL) process according to one aspect of the disclosure.

FIG. 8 shows a cross-sectional view 800 illustrating the IC device of FIG. 6, illustrating the formation of a resist 890 on the barrier seed layer 652 as part of an optional redistribution layer (RDL) process according to one aspect of the disclosure. The resist 890 may be a photoresist or other light sensitive material used in as part of a photolithographic process to form a patterned coating on the barrier seed layer 652.

Figure 9:
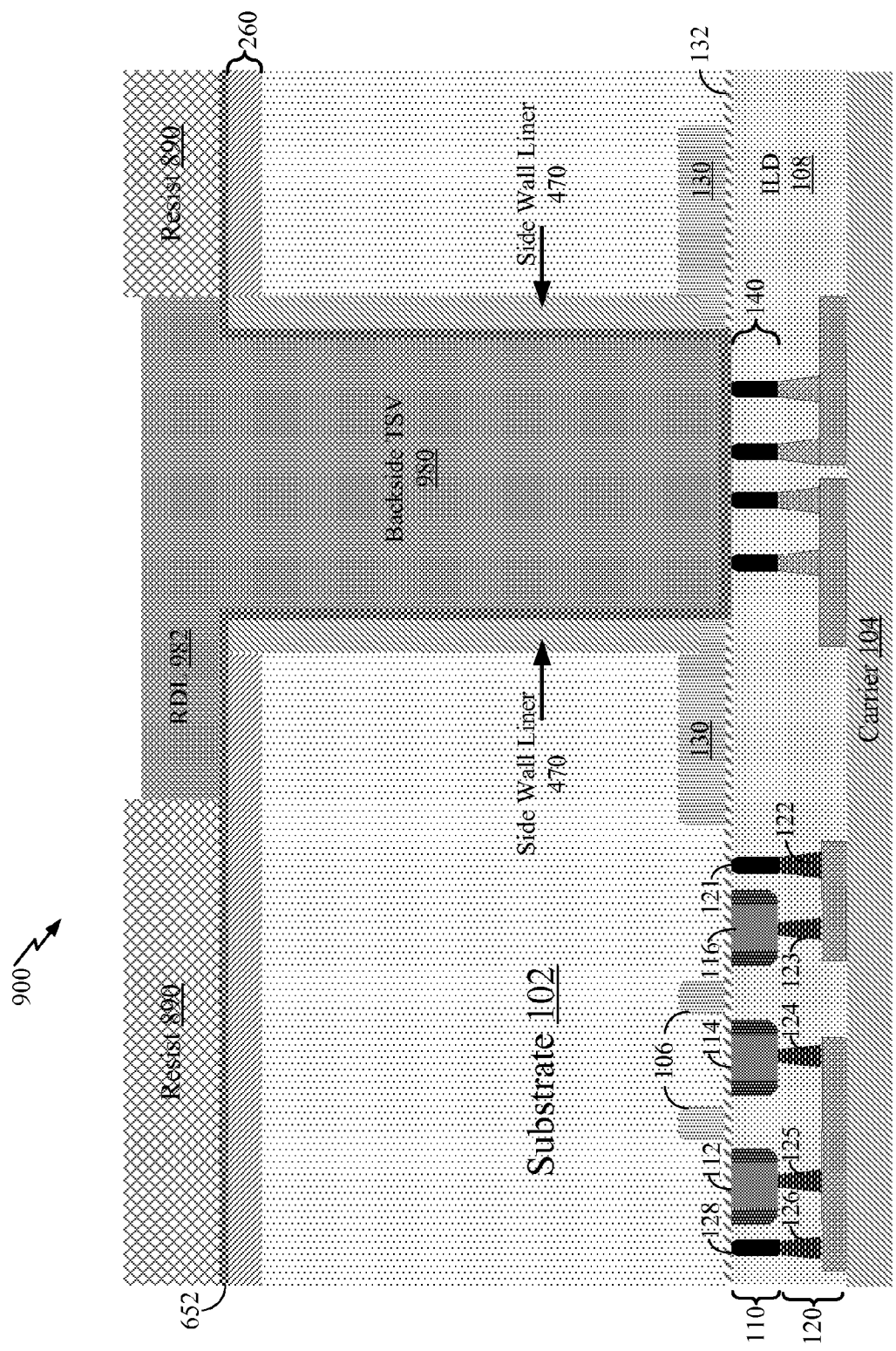
FIG. 9 shows a cross-sectional view illustrating the IC device of FIG. 8, following an electro-chemical deposition and a copper chemical mechanical polish (CMP) process to form a backside TSV according to one aspect of the disclosure.

FIG. 9 shows a cross-sectional view 900 illustrating the IC device of FIG. 8, following an electro-chemical deposition and a chemical mechanical polish (CMP) process to form a backside TSV 980 according to one aspect of the disclosure. The electro-chemical deposition and CMP process also form the RDL 982. The RDL 982 may provide access, for example, to the local interconnects 140 of the MOL interconnect layer 120, or may provide routing on the backside of the wafer between TSVs or other backside components, such as conductive interconnects (e.g., conductive bumps) or other like interconnect structures.

Figure 10:
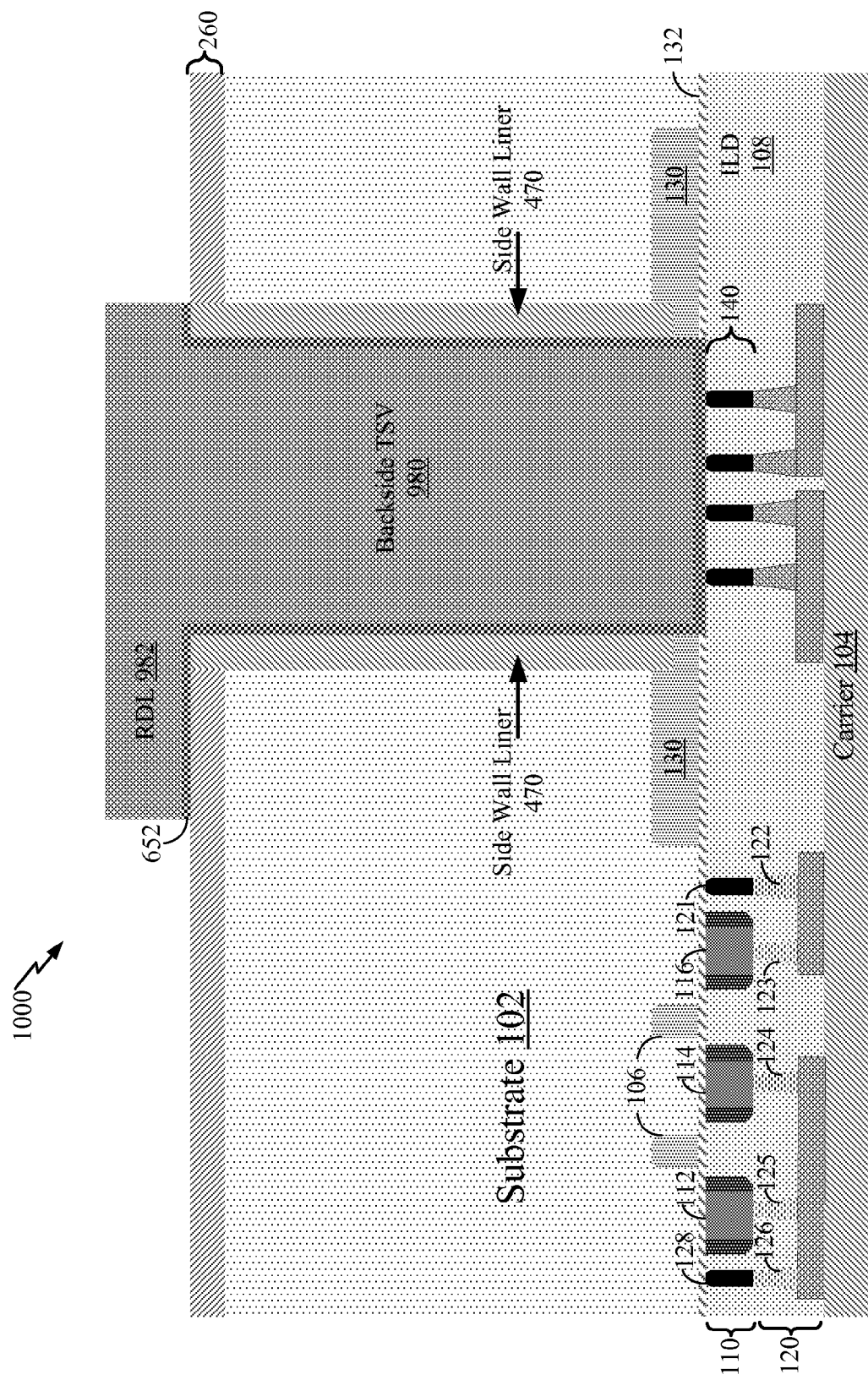
FIG. 10 shows a cross-sectional view of the IC device of FIG. 9, illustrating a completed backside TSV and RDL layer according to one aspect of the disclosure.

FIG. 10 shows a cross-sectional view 1000 of the IC device of FIG. 9, illustrating the backside TSV 980 and the RDL layer 982 after removal of the resist, according to one aspect of the disclosure. In one configuration, a passivation layer (see FIG. 26) is deposited on the RDL 982 and the backside isolation layer 260.

Figure 11:
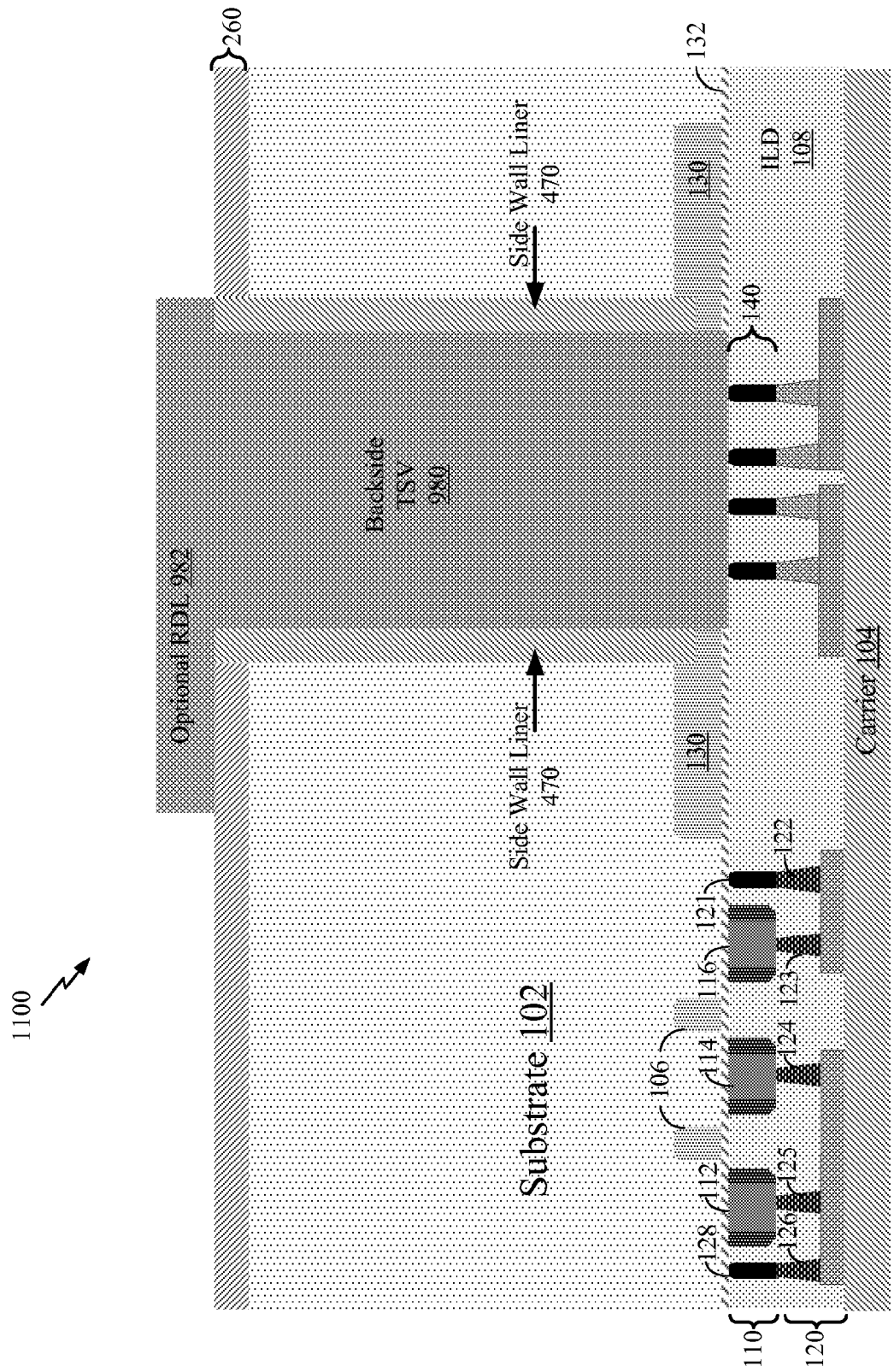
FIG. 11 shows a cross-sectional view of the IC device of FIG. 10, illustrating a completed backside TSV and RDL layer without the barrier seed layer according to one aspect of the disclosure.

FIG. 11 shows a cross-sectional view of an IC device 1100, illustrating a completed, backside TSV 980 and RDL layer 982 without a barrier seed layer according to one aspect of the disclosure. In this configuration, the backside TSV 980 directly contacts the local interconnects of the MOL interconnect layer 120.

Figure 12:
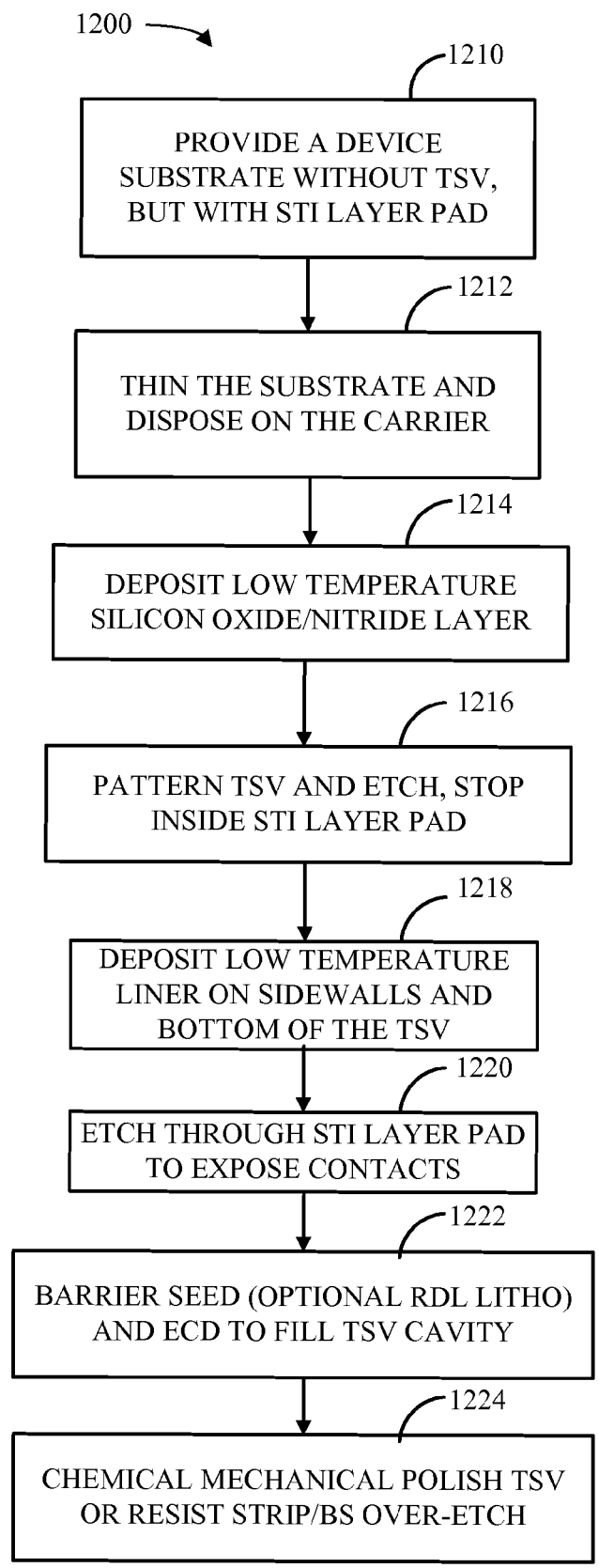
FIG. 12 is a block diagram illustrating a method for integrating through substrate vias (TSVs) into advanced CMOS (complementary metal oxide semiconductor) nodes, according to one aspect of the disclosure.

FIG. 12 is a block diagram illustrating a method 1200 for integrating through substrate vias (TSVs) into advanced CMOS (complementary metal oxide semiconductor) nodes, according to one aspect of the disclosure. At block 1210, an IC device substrate is provided with a shallow trench isolation (STI) layer pad, but without a TSV, for example, as shown in FIG. 1B. Although the present description has mentioned a silicon substrate, other substrate materials are also contemplated. At block 1212, the substrate is thinned in preparation for a backside TSV and the IC device substrate is placed on a carrier, for example, as shown in FIG. 1B.

Referring again to FIG. 12, at block 1214, a low temperature silicon oxide/nitride is deposited to provide a backside isolation layer for the substrate, for example, as shown in FIG. 2. At block 1216, the TSV cavity is patterned and etched to stop inside an STI layer pad. For example, as shown in FIG. 2, the TSV cavity 250 is formed by etching through the semiconductor substrate 102 and into, but not through the STI layer pad 130. At block 1218, a low temperature liner is deposited to line the TSV cavity and a backside isolation layer, for example, as shown in FIG. 3. Alternatively, the low temperature liner is deposited after etching through the STI layer pad, for example, as shown in FIGS. 13 to 26.

For example, as shown in FIG. 4, the isolation liner layer 370 is removed from the bottom of the TSV cavity 250 and the backside isolation layer 260. Removal of the isolation liner layer 370 enables the formation of a sidewall isolation liner layer 470. In one aspect of the disclosure, the sidewall isolation liner layer 470 exhibits a different chemical material property than the films of the STI layer pad 130 and/or the local interconnects 140 of the MOL interconnect layer 120 to provide an improved selectivity for enabling a controlled etch to expose the local interconnects 140.

At block 1220 an etch is performed through the STI layer pad to expose contacts and/or local interconnects from a middle of line (MOL) interconnect layer. For example, as shown in FIG. 5, a directional reactive ion etching along the sidewall isolation liner layer 470 provides a selective and controlled spacer etch to expose the local interconnects 140 without damaging the active devices within the MOL interconnect layer 120. At block 1222, the TSV cavity 250 is filled with a conductive material, for example, as shown in FIGS. 6-7. Although the present description has mentioned a copper filler, other filler materials are also contemplated. As shown in FIGS. 9-11, an optional redistribution layer (RDL) process can be performed to provide a backside TSV including an RDL layer. At block 1224 a chemical mechanical polishing of the backside TSV is performed. Alternatively, a resist strip/barrier seed over-etch may be performed.

In one configuration, the IC device 1100 including a means for conducting that extends through a shallow trench isolation (STI) layer and a substrate. The conducting means has a conductive filler material. In one aspect of the disclosure, the conducting means is the backside through substrate via 780/980 of FIGS. 7 and/or 11, configured to perform the functions recited by the conducting means. In this configuration, the IC device 1100 also includes a means for isolating the conducting means from the substrate that partially extends into but not through an STI layer pad. In one aspect of the disclosure, the isolating means is the sidewall isolation liner layer 470 of FIGS. 4 and 11, configured to perform the functions recited by the isolating means. In another aspect, the aforementioned means may be a device or any layer configured to perform the functions recited by the aforementioned means.

Figure 13:
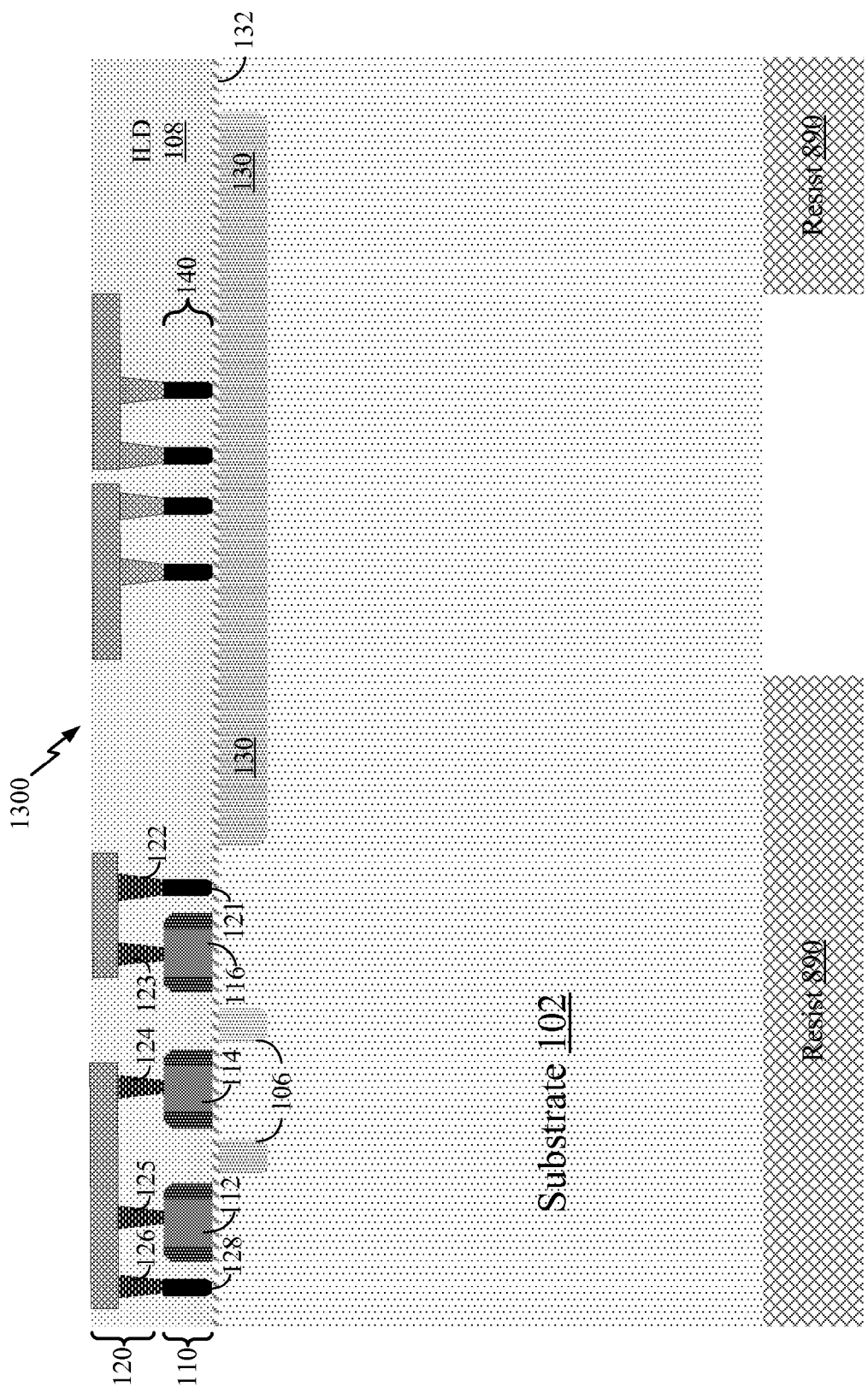
FIG. 13 shows a cross-sectional view illustrating the IC device of FIG. 1A, including a resist to enable the formation of a backside TSV cavity that terminates on an STI layer pad according to one aspect of the disclosure.

FIG. 13 show a cross-sectional view 1300 illustrating the IC device of FIG. 1A, including a resist 890 to enable the formation of a backside TSV cavity that terminates on the STI layer pad 130 according to one aspect of the disclosure. As noted above, aspects of the disclosure involving liner opening lithography are shown in FIGS. 13-26. This aspect of the disclosure includes an additional lithographic process (e.g., a mask) for situations where a material etch cannot be performed in a directional manner, such as the directional etch performed according to the aspects of the disclosure shown in, for example, FIGS. 2 and 5.

Figure 14:
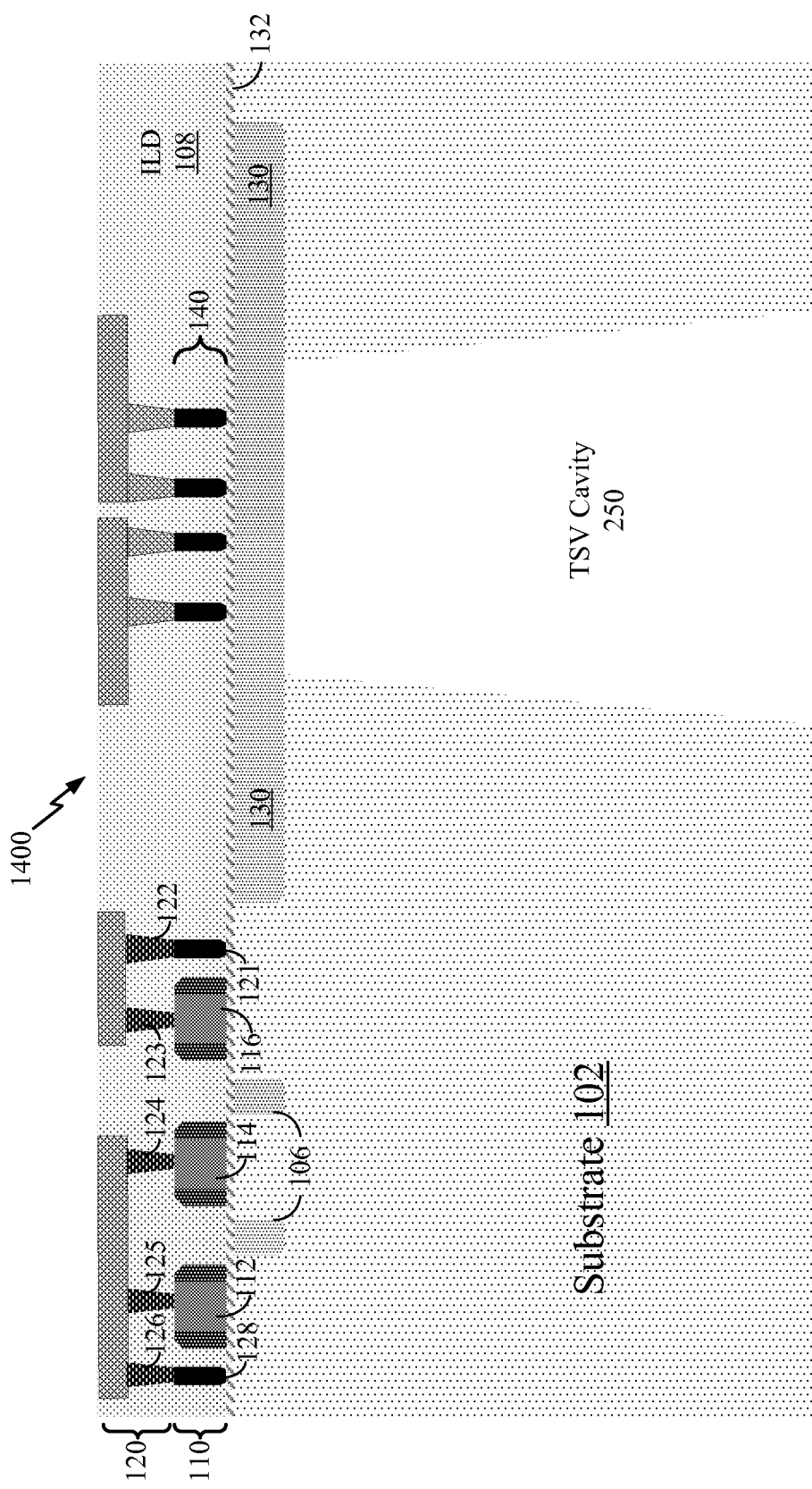
FIG. 14 shows a cross-sectional view illustrating the IC device of FIG. 13, including the backside TSV cavity that terminates on the STI layer pad according to one aspect of the disclosure.

FIG. 14 show a cross-sectional view 1400 illustrating the IC device of FIG. 13, including a TSV cavity 250 that terminates on the STI layer pad 130 according to one aspect of the disclosure. In this configuration, the TSV cavity 250 is patterned and etched to align with the front-side active devices and stop on the STI layer pad 130. In this configuration, a size of the TSV cavity 250 is on the order of 1-20 micro-meters (μms).

Figure 15:
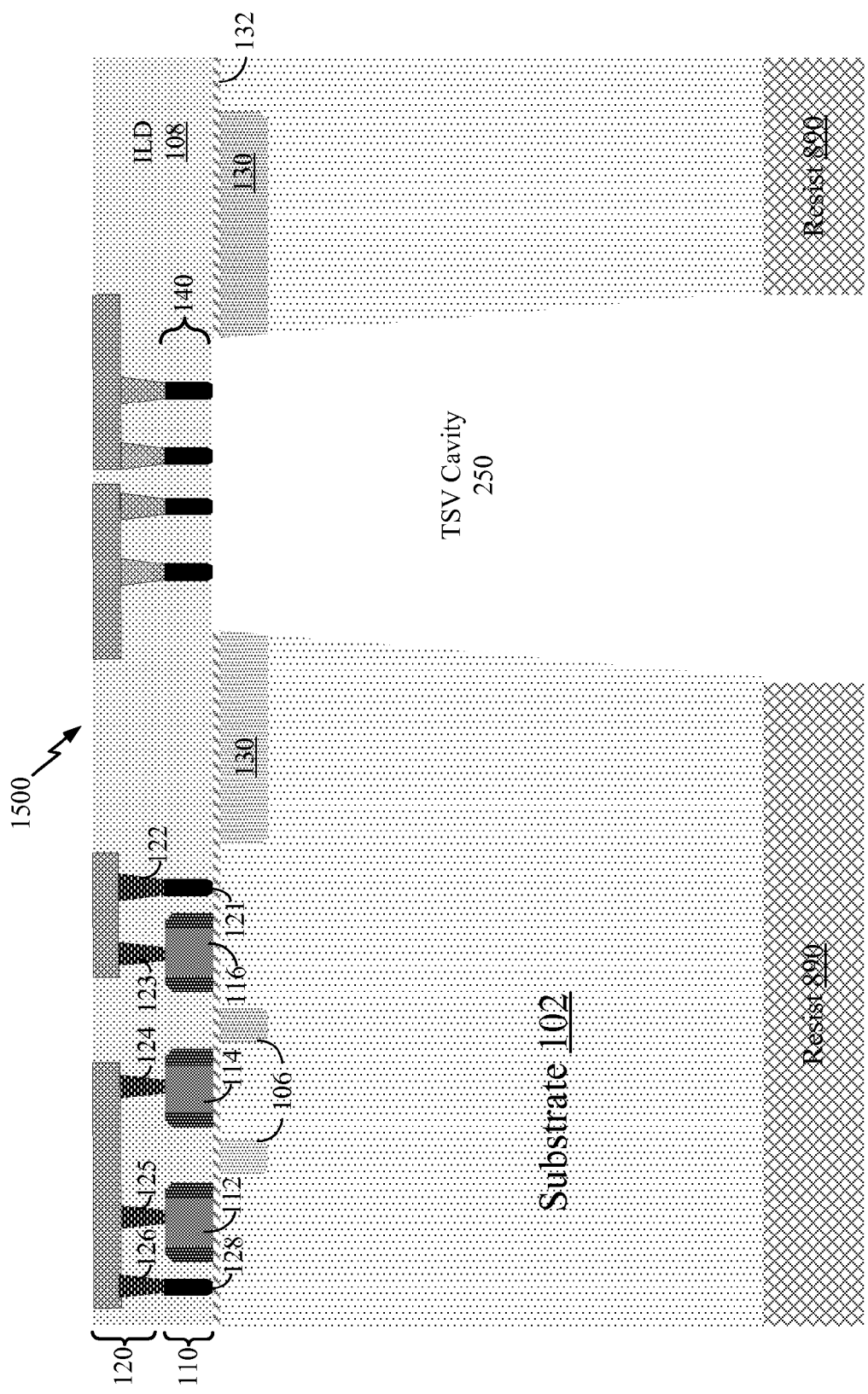
FIG. 15 shows a cross-sectional view illustrating the IC device of FIG. 14, following a controlled, selective etch of the STI layer pad to expose contacts and/or local interconnects from the active devices of a middle of line layer according to one aspect of the disclosure.

FIG. 15 shows a cross-sectional view 1500 illustrating the IC device of FIG. 14, following a controlled, non-directional etch of the STI layer pad 130 to expose a film (not shown) on the contacts and/or the local interconnects 140 of the MOL interconnect layer 120 according to one aspect of the disclosure. In these aspects of the disclosure, a sidewall liner isolation layer is fabricated after etching of the STI layer pad 130, for example, as shown beginning in FIG. 16.

Figure 16:
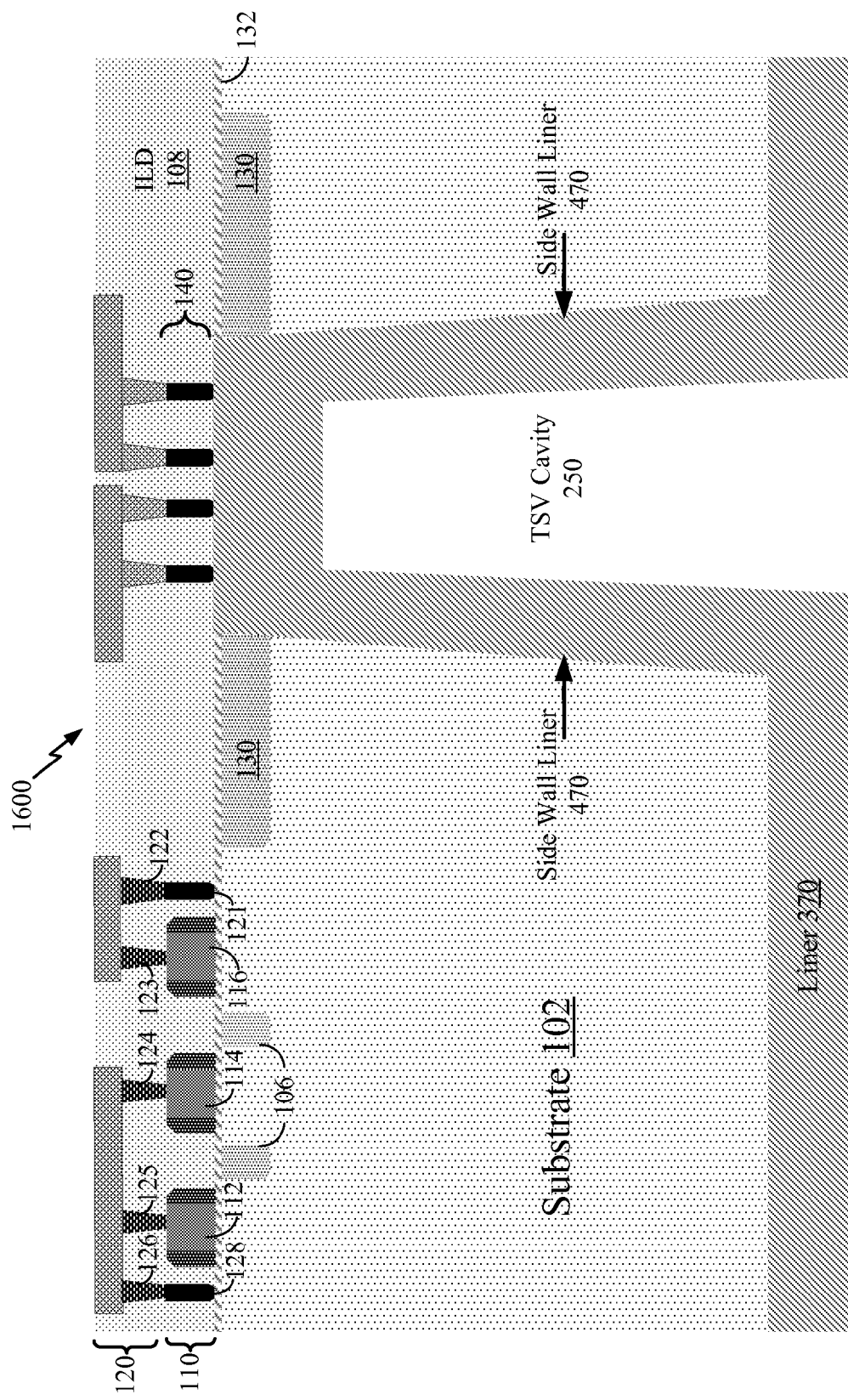
FIG. 16 shows a cross-sectional view of the IC device of FIG. 15, illustrating the deposition of an isolation liner within the TSV cavity and on the backside of a semiconductor substrate according to one aspect of the disclosure.

FIG. 16 shows a cross-sectional view 1600 of the IC device of FIG. 15, illustrating the deposition of an isolation liner layer 370 within the TSV cavity 250 and on the backside of the semiconductor substrate 102 according to one aspect of the disclosure. A plasma deposition may be performed to deposit the isolation liner layer 370 within the TSV cavity 250 and on the backside of the semiconductor substrate 102. The chemical material property of a sidewall isolation liner layer 470 may differ from the films of the local interconnects 140 to facilitate exposure of the contacts of the MOL interconnect layer 120. In this configuration, the isolation liner layer 370 is deposited after etching of the STI layer pad 130, for example, as shown in FIG. 15.

Figure 17:
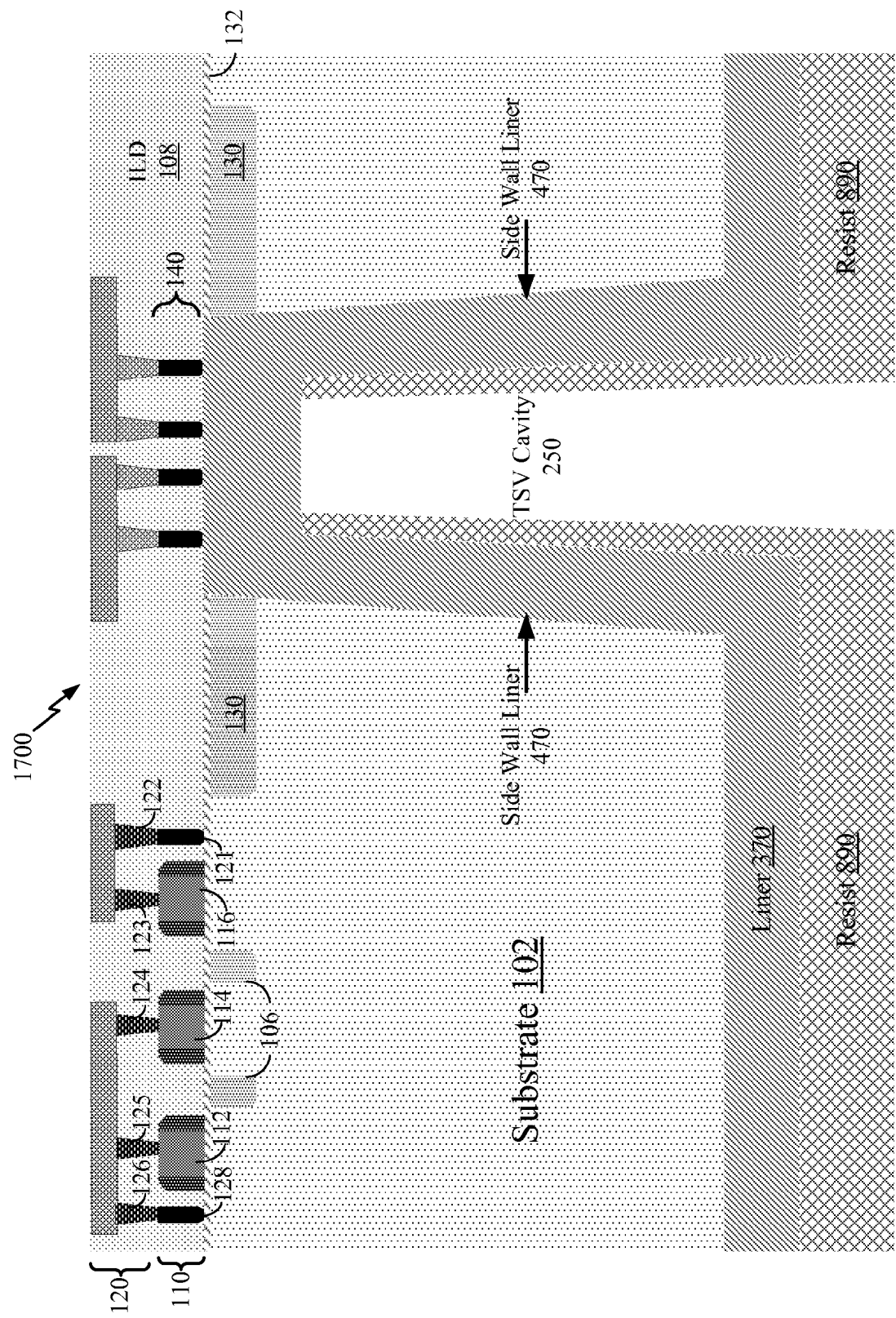
FIG. 17 shows a cross-sectional view of the IC device of FIG. 16, illustrating a resist on the isolation liner to protect a sidewall isolation liner within the TSV cavity according to one aspect of the disclosure.

FIG. 17 shows a cross-sectional view 1700 of the IC device of FIG. 16, illustrating a resist 890 on the isolation liner layer 370 to protect the sidewall isolation liner layer 470 within the TSV cavity 250 according to one aspect of the disclosure. In this aspect of the disclosure, the deposition of the resist 890 is an additional lithographic process for situations where a material etch cannot be performed in a directional manner. In this aspect of the disclosure, the resist 890 protects the sidewall isolation liner layer 470 from a non-directional etch that is performed to expose the local interconnects 140 of the MOL interconnect layer 120, for example, as shown in FIG. 18.

Figure 18:
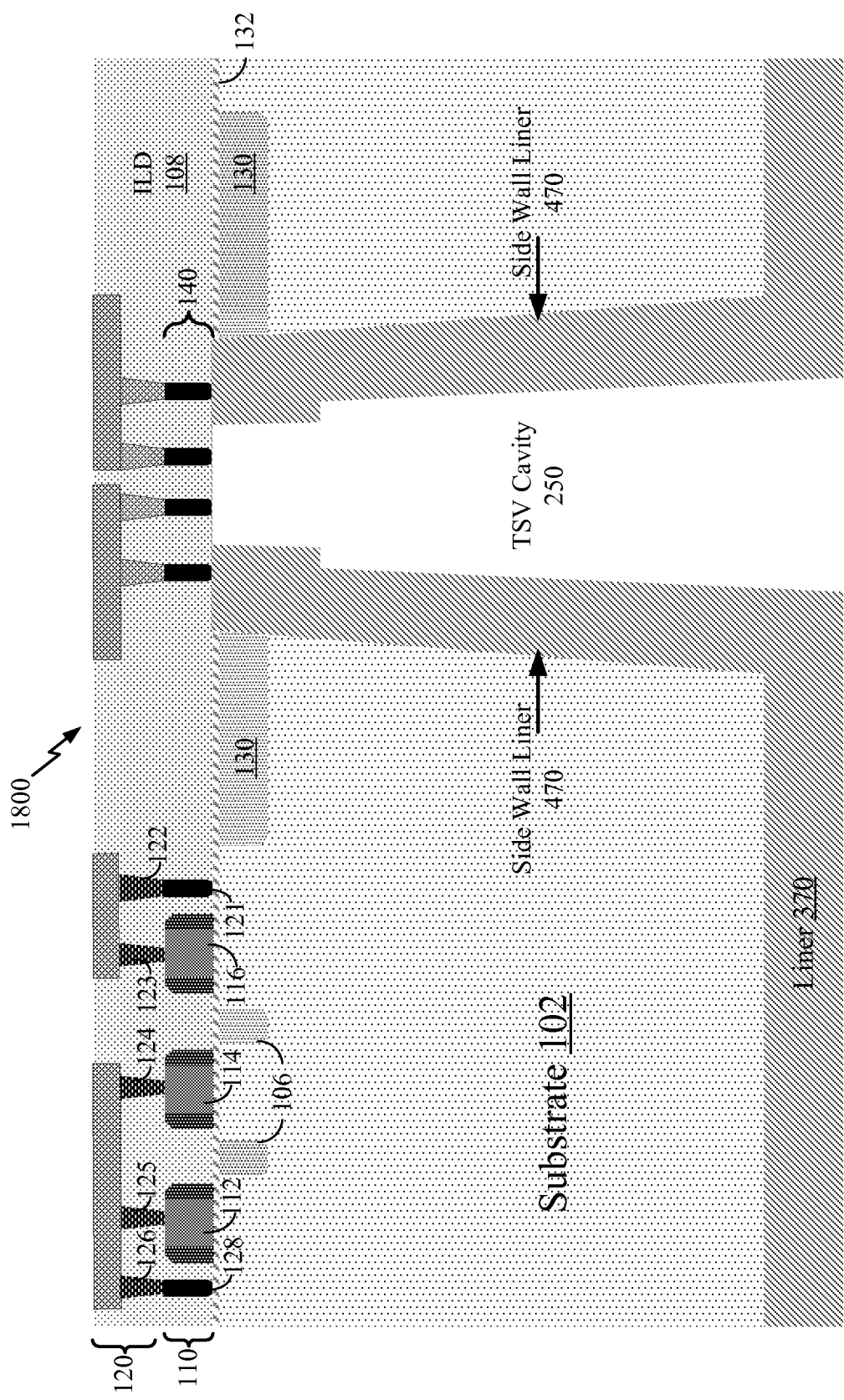
FIG. 18 shows a cross-sectional view illustrating the IC device of FIG. 17, following a non-directional etch of an isolation liner at the bottom of the TSV cavity to expose contacts and/or local interconnects from the active devices of a middle of line layer according to one aspect of the disclosure.

FIG. 18 shows a cross-sectional view 1800 illustrating the IC device of FIG. 17, following a non-directional etch of the isolation liner layer 370 and film (not shown) at the bottom of the TSV cavity 250 to expose contacts and/or the local interconnects 140 from the active devices of the MOL interconnect layer 120 according to one aspect of the disclosure. In this configuration, the isolation liner layer 370 at the bottom of the TSV cavity 250 exhibits a different chemical material property than the films of the local interconnects 140 of the MOL interconnect layer 120. This configuration provides improved selectivity for enabling a controlled, non-directional etch to expose the local interconnects 140 of the MOL interconnect layer 120. A wet etch may also be used to open the isolation liner layer 370 at the bottom of the TSV cavity 250 to expose the local interconnects 140 of the MOL interconnect layer 120.

Figure 19:
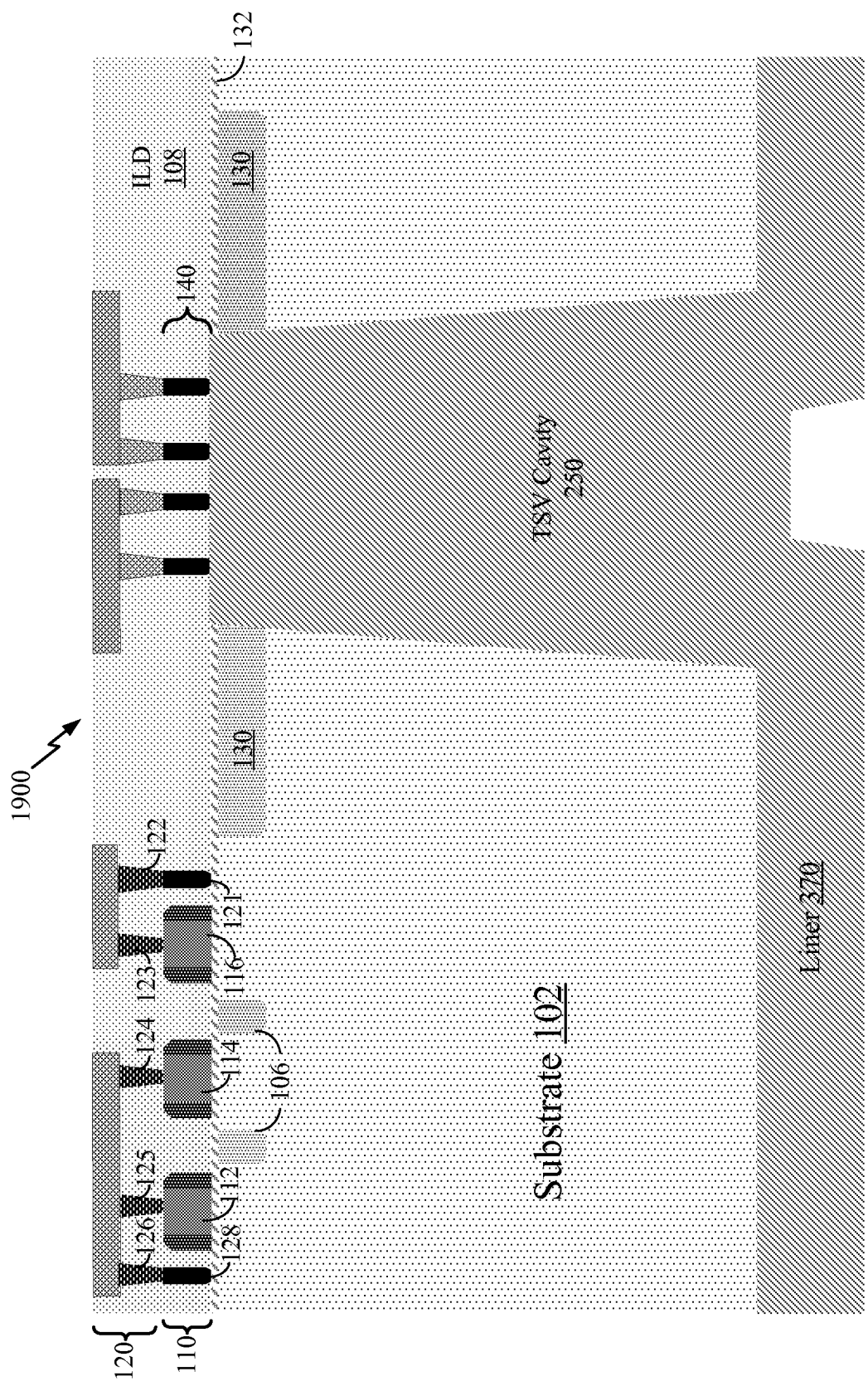
FIG. 19 shows a cross-sectional view of the IC device of FIG. 15, illustrating the deposition of an isolation liner that fills the TSV cavity and is disposed on the backside of a semiconductor substrate according to one aspect of the disclosure.

An alternative process for depositing the isolation liner layer 370 is described with respect to FIG. 19. FIG. 19 shows a cross-sectional view 1900 of the IC device of FIG. 15, illustrating the deposition of an isolation liner layer 370 that fills the TSV cavity 250 and is disposed on the backside of the semiconductor substrate 102 according to one aspect of the disclosure. In this configuration, a polymer spin-on process fills the TSV cavity 250 with the isolation liner layer 370. While a polymer spin-on process is described as filling the TSV cavity with respect to FIG. 19, any other process that fills the TSV cavity 250 with an insulating material may be used to obtain the same result. The isolation liner layer 370 may be formed with a layer of polymer, silicon oxide, silicon nitride, or other like precursor for forming an oxide film.

Figure 20:
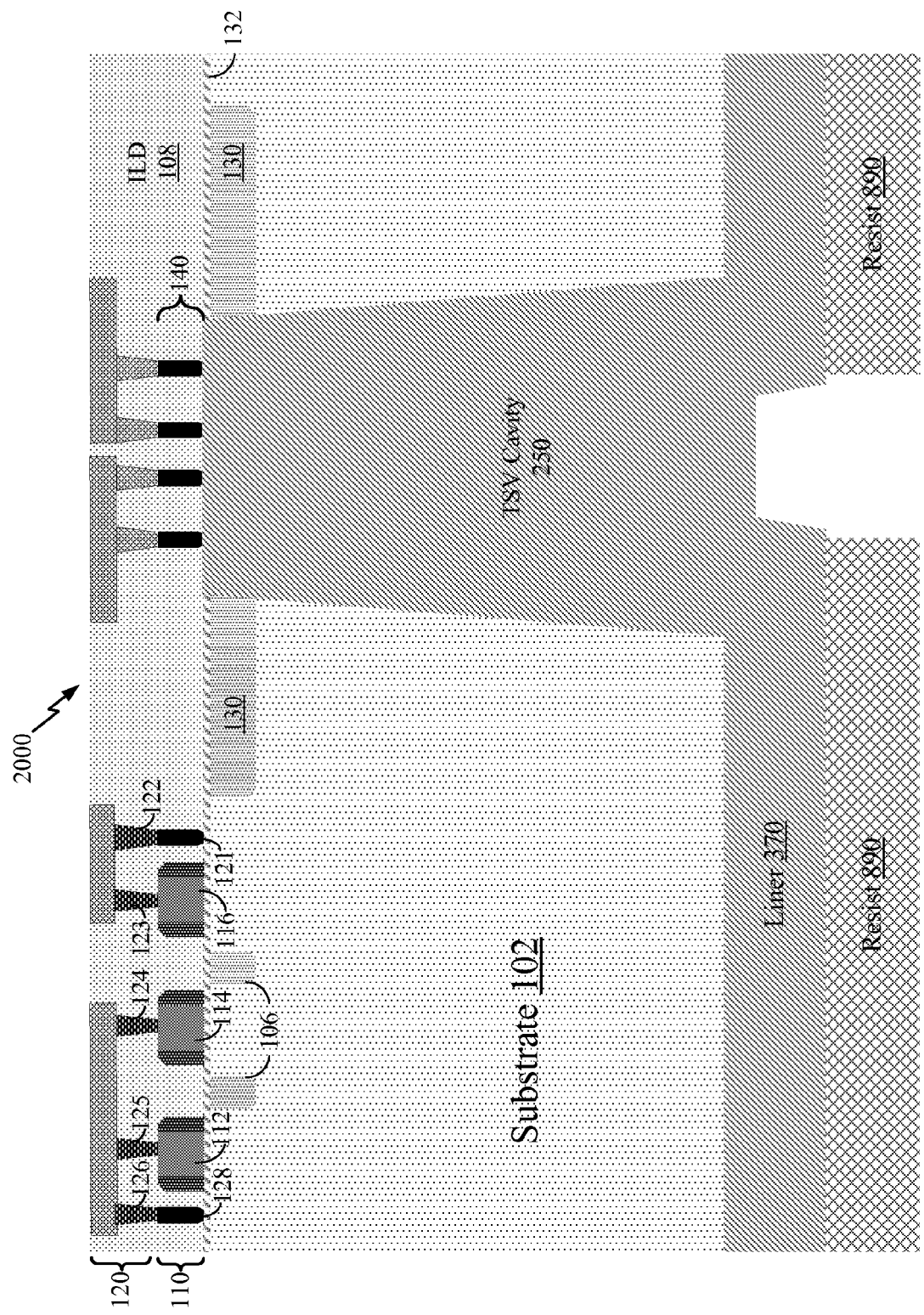
FIG. 20 shows a cross-sectional view of the IC device of FIG. 19, illustrating a resist on the isolation liner prior to a non-directional etch of an isolation liner at the bottom of the TSV cavity to expose contacts and/or local interconnects from the active devices of the middle of line layer according to one aspect of the disclosure.

FIG. 20 shows a cross-sectional view 2000 of the IC device of FIG. 19, illustrating a resist 890 on the isolation liner layer 370 according to one aspect of the disclosure. Representatively, the resist 890 is formed on a portion of the isolation liner layer 370 on a backside of the semiconductor substrate 102. A non-directional etch of the isolation liner layer 370 within the TSV cavity 250 may be performed to expose contacts and/or the local interconnects 140 from the active devices of the MOL interconnect layer 120, for example, as shown in FIG. 21.

Figure 21:
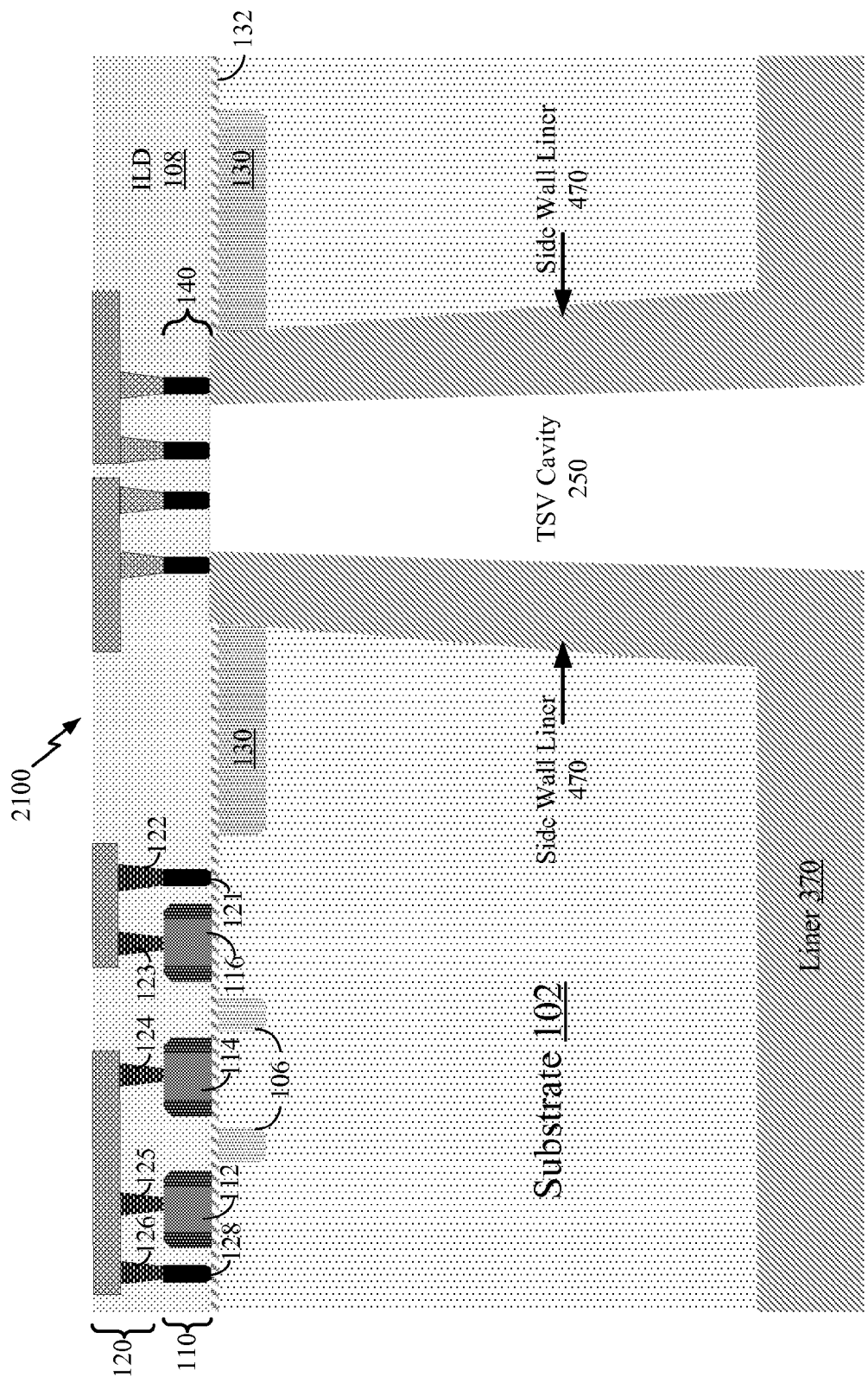
FIG. 21 shows a cross-sectional view illustrating the IC device of FIG. 20, following a non-directional etch of an isolation liner within the TSV cavity to expose contacts and/or local interconnects from the active devices of the middle of line layer according to one aspect of the disclosure.

FIG. 21 shows a cross-sectional view 2100 illustrating the IC device of FIG. 20, following a non-directional etch of the isolation liner layer 370 within the TSV cavity 250 according to one aspect of the disclosure. In this configuration, the non-directional etch of the isolation liner layer 370 exposes the local interconnects 140 of the MOL interconnect layer 120. This configuration provides improved selectivity for enabling a controlled, non-directional etch to expose the local interconnects 140 of the MOL interconnect layer 120 due to the different chemical mechanical property of the isolation liner layer 370 from the films of the local interconnects 140. A wet etch may also be used to open the isolation liner layer 370 within the TSV cavity 250 to expose the local interconnects 140 of the MOL interconnect layer 120.

Figure 22:
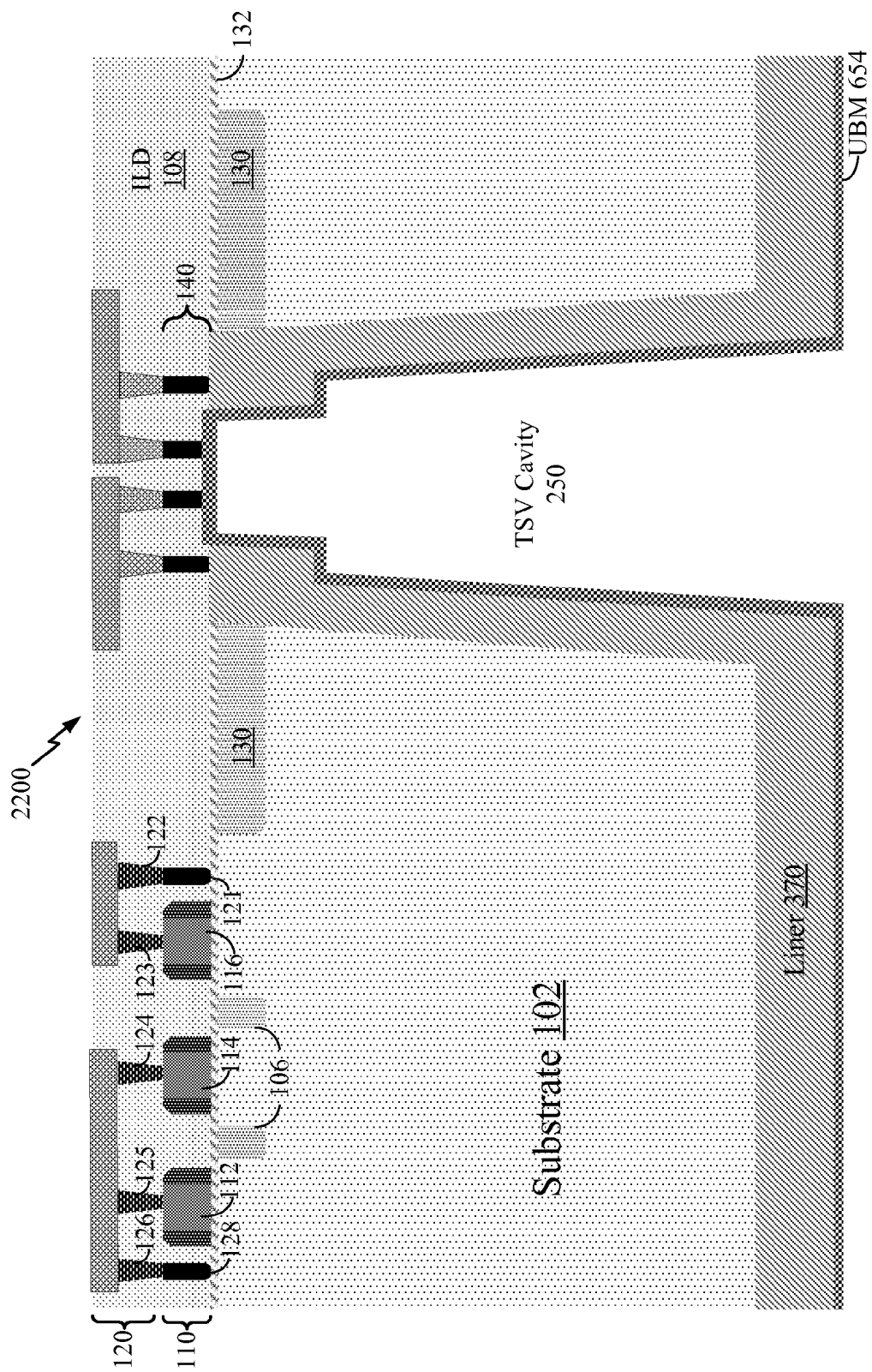
FIG. 22 shows a cross-sectional view illustrating the IC device of FIG. 21, following a TSV barrier seed process according to one aspect of the disclosure.
Figure 23:
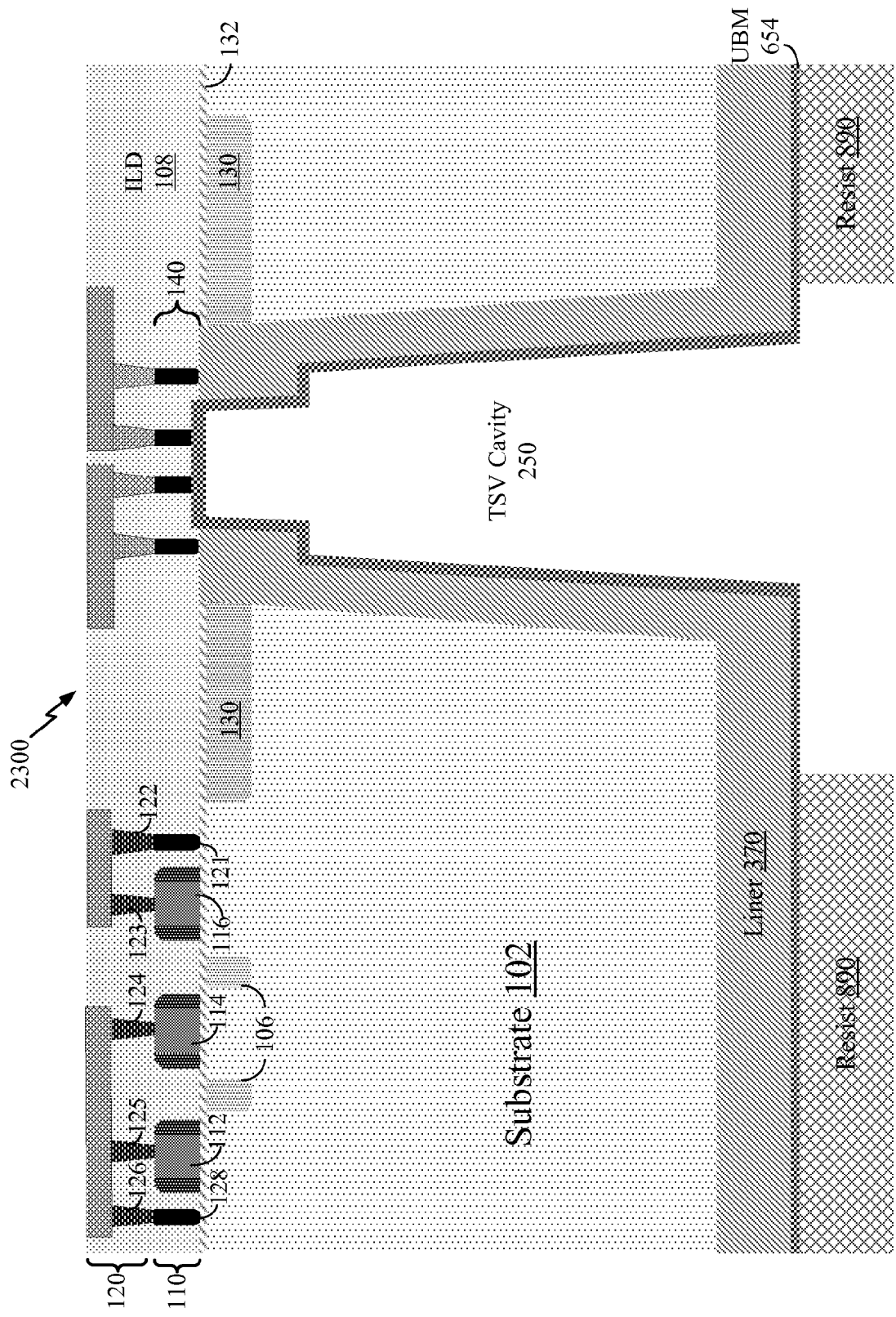
FIG. 23 shows a cross-sectional view illustrating the IC device of FIG. 22, illustrating the formation of a resist on the barrier seed layer as part of an optional redistribution layer (RDL) process according to one aspect of the disclosure.

FIG. 22 shows a cross-sectional view 2200 illustrating the IC device of FIG. 21, following a TSV barrier seed process according to one aspect of the disclosure. As shown in FIG. 22, the TSV barrier seed process lines the TSV cavity 250 with a filler material in preparation for continued formation of a backside TSV, as shown in FIG. 23. In one configuration, the filler material deposited by the TSV barrier seed process provides an under bump metallization (UBM) layer 654.

FIG. 23 shows a cross-sectional view 2300 illustrating the IC device of FIG. 22, depicting the formation of a resist 890 on the UBM layer 654 as part of an optional redistribution layer (RDL) process according to one aspect of the disclosure. The resist 890 may be a photoresist or other light sensitive material used as part of a photolithographic process to form a patterned coating on the UBM layer 654.

Figure 24:
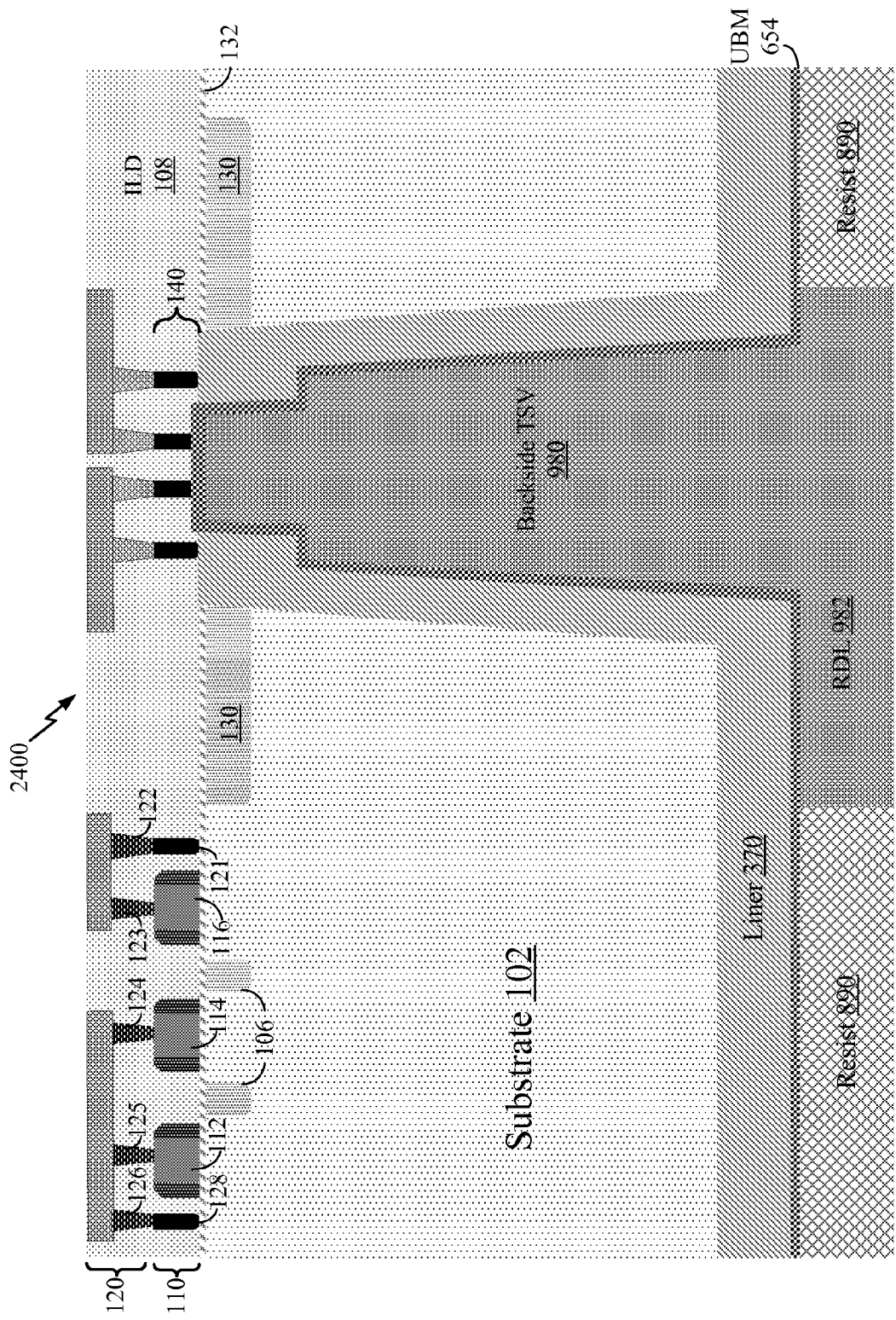
FIG. 24 shows a cross-sectional view illustrating the IC device of FIG. 23, following an electro-chemical deposition and a copper chemical mechanical polish (CMP) process to form a backside TSV according to one aspect of the disclosure.

FIG. 24 shows a cross-sectional view illustrating the IC device of FIG. 23, following an electro-chemical deposition and a chemical mechanical polish (CMP) process to form a backside TSV 980 according to one aspect of the disclosure. The electro-chemical deposition and CMP process also form the RDL 982. The RDL 982 may provide access, for example, to the local interconnects 140 of the MOL interconnect layer 120.

Figure 25:
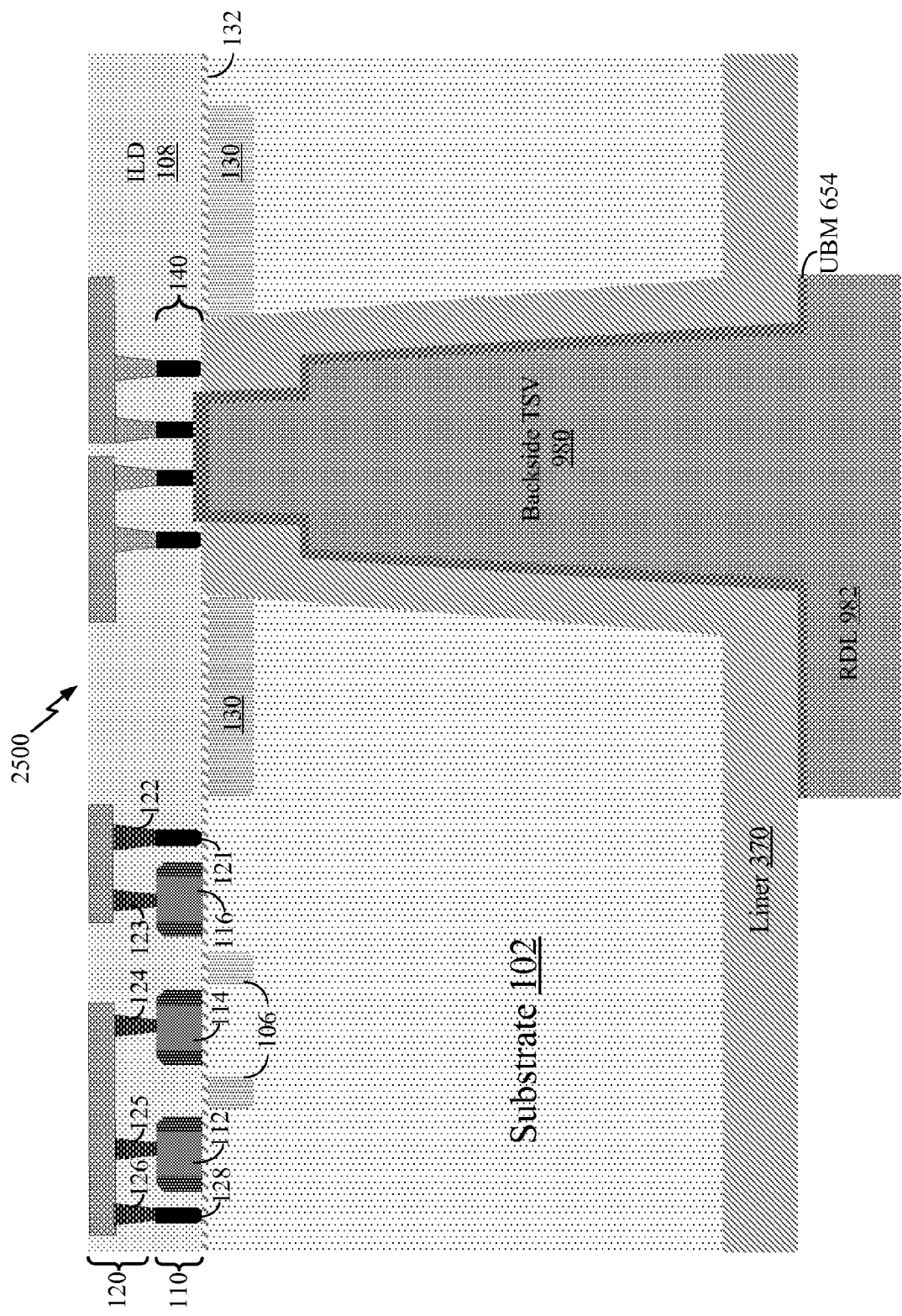
FIG. 25 shows a cross-sectional view of the IC device of FIG. 24, illustrating a completed backside TSV and RDL layer according to one aspect of the disclosure.

FIG. 25 shows a cross-sectional view 2500 of the IC device of FIG. 24 after removal of the resist, illustrating the backside TSV 980 and the RDL layer 982 according to one aspect of the disclosure. This configuration may be similar to the configuration shown in FIG. 11.

Figure 26:
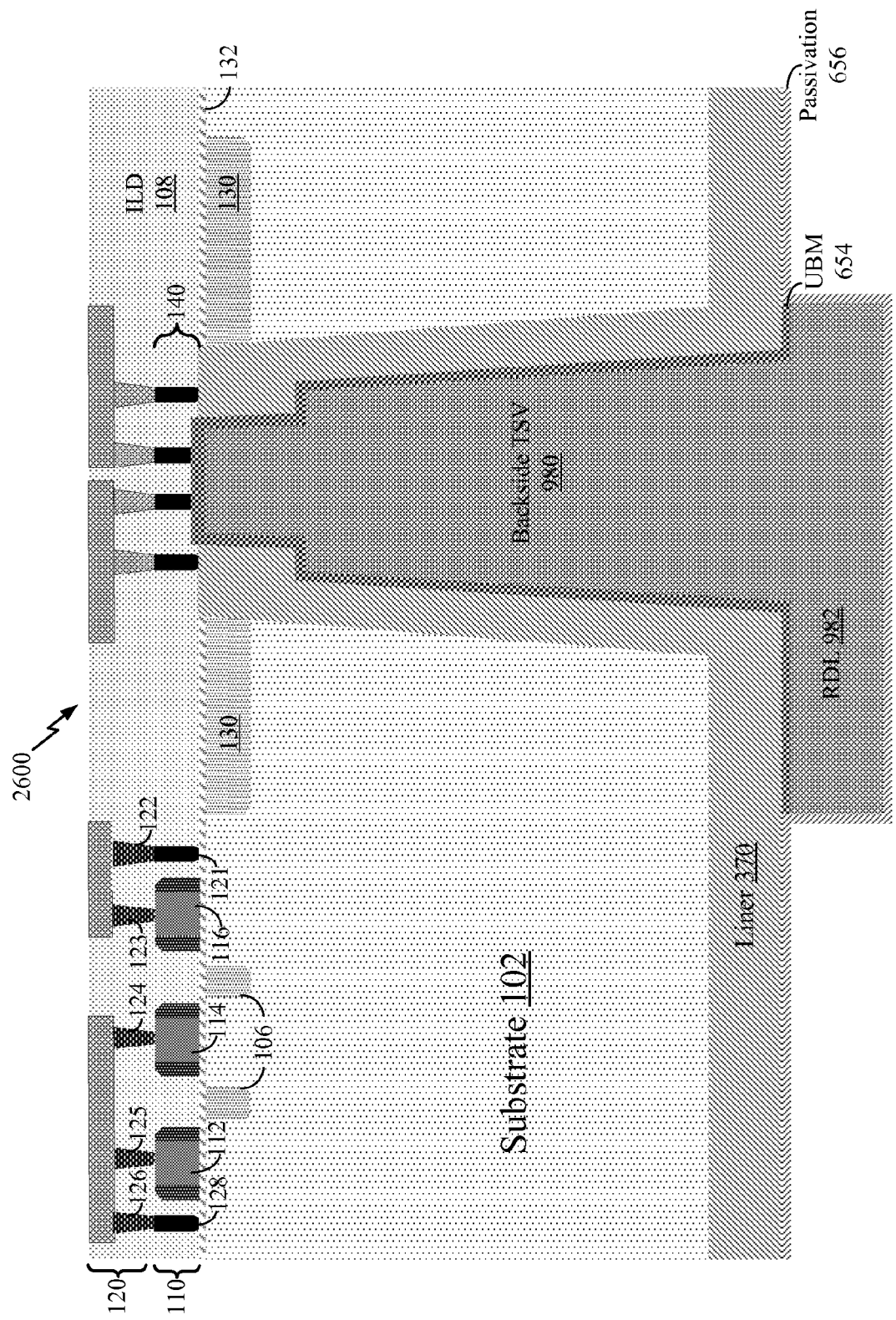
FIG. 26 shows a cross-sectional view of the IC device of FIG. 25, illustrating a completed backside TSV and RDL layer, including a passivation layer according to one aspect of the disclosure.

FIG. 26 shows a cross-sectional view 2600 of the IC device of FIG. 25, illustrating the backside TSV 980 and the RDL layer 982, including a passivation layer 656 according to one aspect of the disclosure. In this configuration, the passivation layer 656 is deposited on the RDL 982 and the portions of the isolation liner layer 370 on the backside of the semiconductor substrate 102. The backside TSV 980 formed according to FIGS. 14 to 26 involves the additional lithographic process, for example, as shown in FIG. 17. The deposition of the resist 890 involves an additional lithographic mask for situations where a material etch cannot be performed in a directional manner.

In this aspect of the disclosure, the resist 890 protects the sidewall isolation liner layer 470 from the non-directional etch that is performed to expose the local interconnects 140 of the MOL interconnect layer 120, for example, as shown in FIG. 18. This additional lithographic mask simplifies the etch process for exposing the local interconnects 140 of the MOL interconnect layer 120. Because the sidewall isolation liner layer 470 is protected, a non-directional etch, a wet etch, or other like non-directional etch may be used to expose the local interconnects 140 of the MOL interconnect layer 120.

Figure 27:
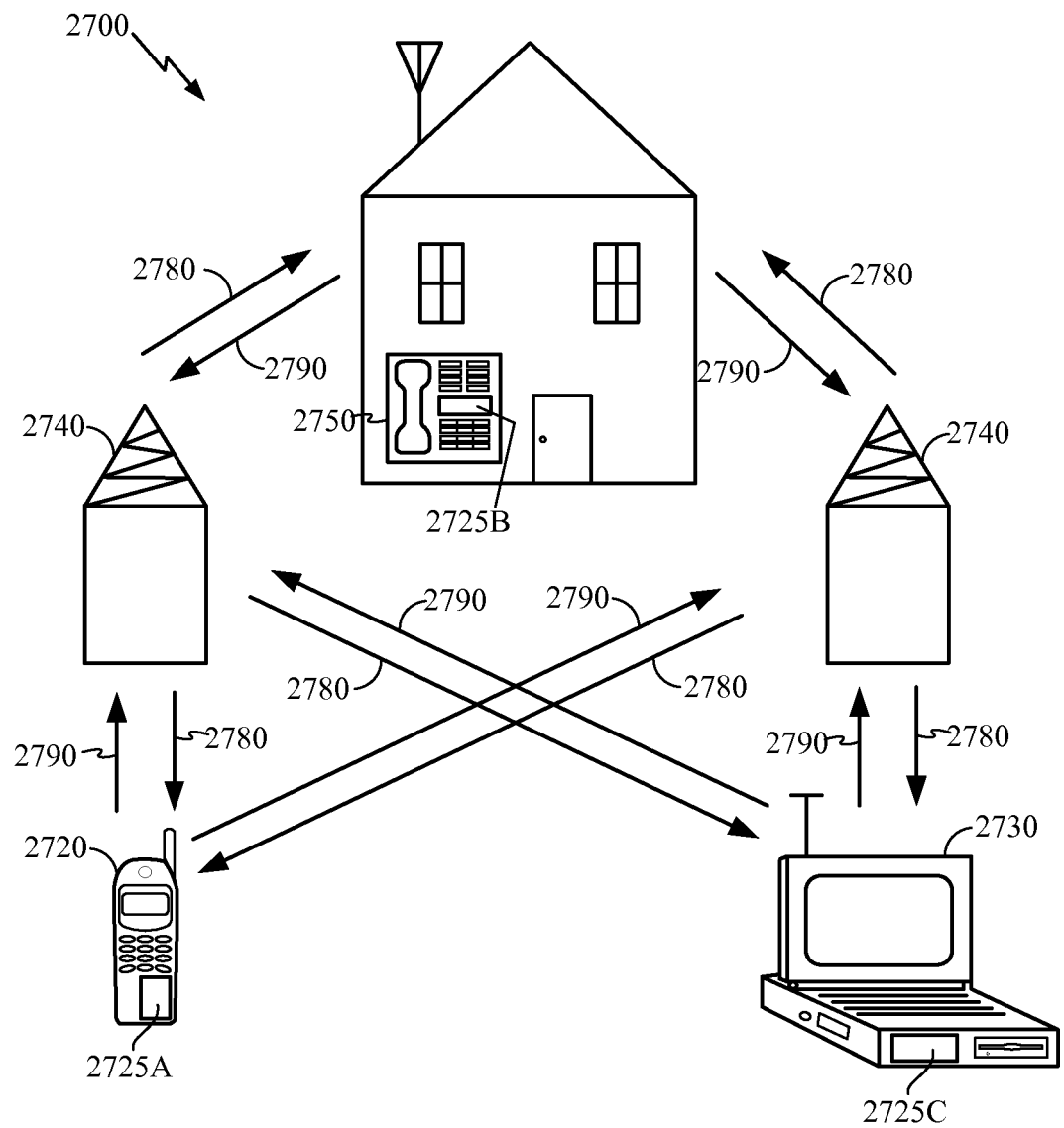
FIG. 27 is a block diagram showing a wireless communication system in which a configuration of the disclosure may be advantageously employed.

FIG. 27 is a block diagram showing an exemplary wireless communication system 2700 in which a configuration of the disclosure may be advantageously employed. For purposes of illustration, FIG. 27 shows three remote units 2720, 2730, and 2750 and two base stations 2740. It will be recognized that wireless communication systems may have many more remote units and base stations. Remote units 2720, 2730, and 2750 include IC devices 2725A, 2725B, and 2725C, which include the disclosed backside through substrate via (TSV). It will be recognized that any device containing an IC may also include a backside TSV disclosed herein, including the base stations, switching devices, and network equipment. FIG. 27 shows forward link signals 2780 from the base station 2740 to the remote units 2720, 2730, and 2750 and reverse link signals 2790 from the remote units 2720, 2730, and 2750 to base stations 2740.

In FIG. 27, remote unit 2720 is shown as a mobile telephone, remote unit 2730 is shown as a portable computer, and remote unit 2750 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof. Although FIG. 27 illustrates IC devices 2725A, 2725B, and 2725C, which include the disclosed backside through substrate via (TSV), the disclosure is not limited to these exemplary illustrated units. Aspects of the present disclosure may be suitably employed in any device, which includes a backside TSV.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device comprising:
   a semiconductor substrate;
   a shallow trench isolation (STI) layer pad over a surface of the semiconductor substrate;
   an inter-layer dielectric (ILD) layer on a contact etch stop layer, the contact etch stop layer separating the ILD layer from the STI layer pad; and
   a through substrate via extending through the semiconductor substrate and partially into, but not through, the STI layer pad, and the through substrate via comprising a conductive filler material and a sidewall isolation liner layer, the sidewall isolation liner layer having a portion that extends into, but not through, the STI layer pad.

2. The semiconductor device of claim 1, in which a chemical material composition of the sidewall isolation liner layer is different from a chemical material composition of the at least one contact within the ILD layer or a chemical composition of the STI layer pad.

3. The semiconductor device of claim 1, in which the sidewall isolation liner layer is comprised of a material selected from a group consisting of a polymer, silicon nitride, and silicon oxide.

4. The semiconductor device of claim 1, further comprising a redistribution layer coupled to the conductive filler material of the through substrate via.

5. The semiconductor device of claim 1, incorporated into at least one of a music player, a video player, an entertainment unit, a navigation device, a communications device, a personal digital assistant (PDA), a fixed location data unit, or a computer.

6. A semiconductor device comprising:
   a semiconductor substrate;
   a shallow trench isolation (STI) layer pad over a surface of the semiconductor substrate;

an inter-layer dielectric (ILD) layer on a contact etch stop layer, the contact etch stop layer separating the ILD layer from the STI layer pad; and means for conducting through a substrate, the conducting means extending through the semiconductor substrate and partially into, but not through, the STI layer pad, the conducting means comprising a means for isolating sidewalls of the conducting means, the isolating means having a portion that extends into, but not through, the STI layer pad.

7. The semiconductor device of claim 6, in which a chemical material composition of the isolating means is different from a chemical material composition of the contact within the ILD layer or a chemical composition of the STI layer pad.

8. The semiconductor device of claim 6, in which the isolating means comprises a material selected from a group consisting of a polymer, silicon nitride, and silicon oxide.

9. The semiconductor device of claim 6, further comprising a redistribution layer coupled to the means for conducting.

10. The semiconductor device of claim 6, incorporated into at least one of a music player, a video player, an entertainment unit, a navigation device, a communications device, a personal digital assistant (PDA), a fixed location data unit, or a computer.

* * * * *